(12) United States Patent
Bybee

(10) Patent No.: US 7,521,990 B2
(45) Date of Patent: Apr. 21, 2009

(54) NOISE REDUCTION CIRCUITS

(75) Inventor: John William Bybee, Half Moon Bay, CA (US)

(73) Assignee: Bybee Power, LLC, El Granada, CA (US)

( * ) Notice: Subject to any disclaimer, the term of this patent is extended or adjusted under 35 U.S.C. 154(b) by 0 days.

(21) Appl. No.: 11/871,945

(22) Filed: Oct. 12, 2007

(65) Prior Publication Data

US 2008/0088363 A1 Apr. 17, 2008

Related U.S. Application Data

(60) Provisional application No. 60/851,482, filed on Oct. 12, 2006.

(51) Int. Cl.
*H03K 5/00* (2006.01)
(52) U.S. Cl. .................... 327/552; 327/557; 327/311
(58) Field of Classification Search ......... 327/551–559, 327/311
See application file for complete search history.

(56) References Cited

U.S. PATENT DOCUMENTS

| | | | | |
|---|---|---|---|---|
| 5,451,852 | A * | 9/1995 | Gusakov | 318/611 |
| 6,525,602 | B1 * | 2/2003 | Tomasini et al. | 327/562 |
| 7,187,229 | B2 * | 3/2007 | Pelly | 327/551 |

* cited by examiner

*Primary Examiner*—Dinh T. Le
(74) *Attorney, Agent, or Firm*—Craig M. Stainbrook; Stainbrook & Stainbrook, LLP

(57) ABSTRACT

A noise reduction circuit for AC power, AC power neutral lines, and DC power. In a first embodiment for use with AC power, the invention operates by subtracting the error voltage from an incoming AC signal boosted in voltage by a small boost transformer. In a second embodiment, the present invention reduces noise in AC power neutral lines by effectively operating as a power corrector and reduces unwanted noise on the neutral line at all frequencies without introducing unwanted current in the ground line. In a third embodiment, the invention reduces noise in DC power supplies.

15 Claims, 15 Drawing Sheets

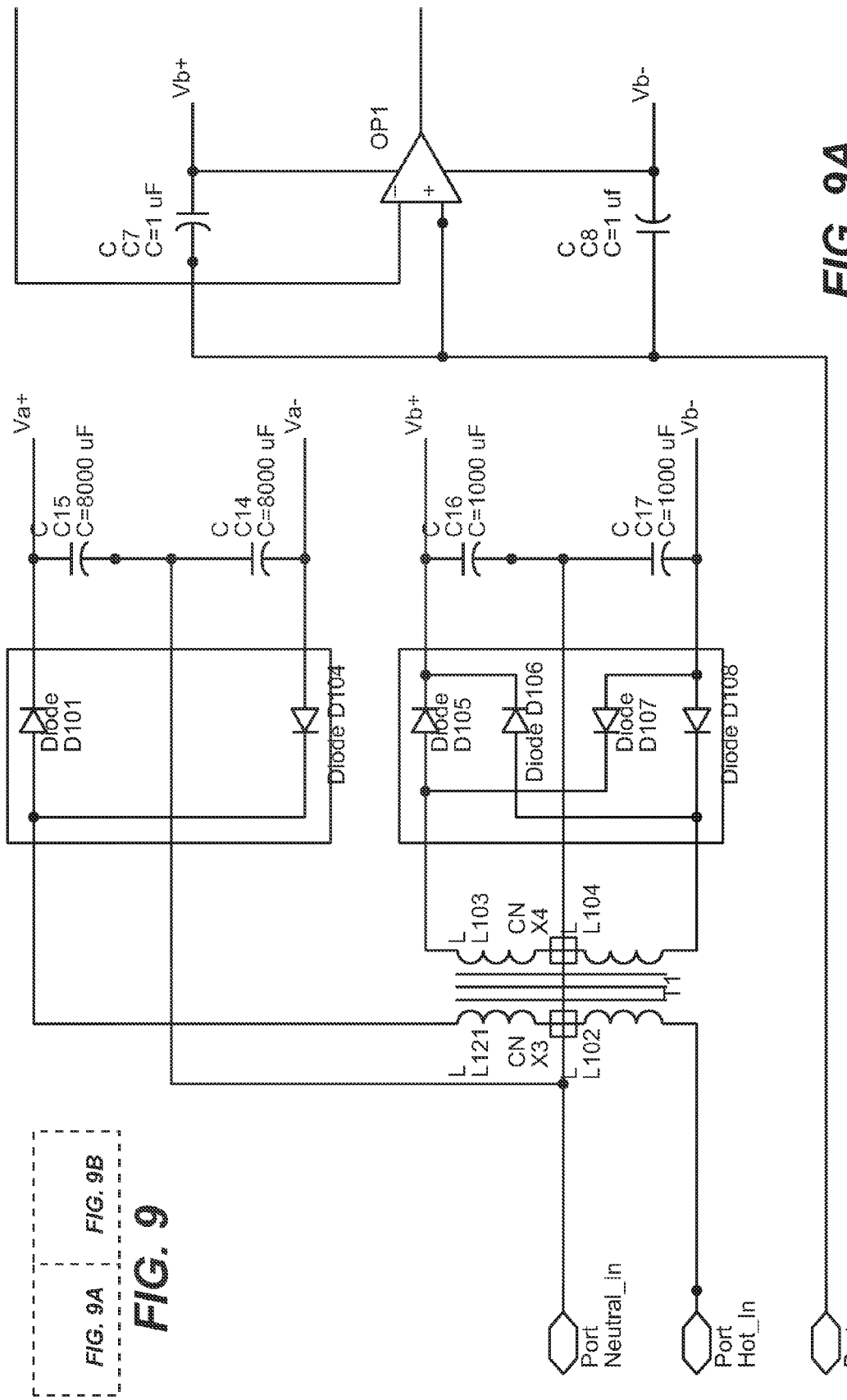

NOISE REDUCTION CIRCUITS

CROSS REFERENCES TO RELATED APPLICATIONS

The present application claims the benefit of U.S. Provisional Patent Application Ser. No. 60/851,482 filed Oct. 12, 2006 (Oct. 12, 2006).

STATEMENT REGARDING FEDERALLY SPONSORED RESEARCH OR DEVELOPMENT

Not applicable.

THE NAMES OR PARTIES TO A JOINT RESEARCH AGREEMENT

Not applicable.

INCORPORATION-BY-REFERENCE OF MATERIAL SUBMITTED ON A COMPACT DISC

Not applicable.

BACKGROUND OF THE INVENTION

1. Field of the Invention

The present invention relates generally to noise reduction circuits, and more particularly to noise reduction circuits for AC power, flexible noise reduction circuits for DC power supplies, and noise reduction circuits for AC power neutral lines.

2. Discussion of Related Art Including Information Disclosed Under 37 CFR §§1.97, 1.98:

Alternating current power supplied by the utilities power grid is contaminated with noise from a wide variety of sources, including electric appliances, computers, equipment having switching power supplies, automotive ignition systems, radio transmitters, etc. These and other sources of noise and contamination leave the power spectrum of AC power dense with harmonic and spurious noise. When this noise is left untreated, it enters sensitive electronic equipment and degrades performance in a number of ways. Specifically, audio and video equipment produce less pleasing results for the end user. Laboratory equipment, imaging equipment, and other commercial and scientific equipment suffer as well.

Prior solutions to the problem of noise in AC power circuits fit into three main categories: passive power conditioners, power regenerators, and power correctors. The invention fits into the category of power correctors, but for the sake of background, a brief statement for each of the categories follows.

In countries where AC power is supplied by two wires, one of which is electrically tied to a ground connection (earth), the power is said to be single ended or unbalanced. The United States is one such country. The line that is tied to ground is called the neutral line. For optimum performance of electrical equipment, it is desired that the noise level on the neutral line be suppressed with respect to ground. Though the neutral line is connected to ground at the entrance to a building, the neutral line is not usually electrically quiet at the service jack (wall) because of voltage drops that occur along the length of the neutral wire in response to current provided by the neutral line. This neutral wire noise is the subject of the second preferred embodiment of the present invention disclosure.

Prior solutions to the problem of noise in the neutral line of AC power fit into two main categories: passive filtering and balanced power regeneration.

Passive power conditioners that address either or both of the aforementioned problems take the form of low pass or band pass filters. They are generally capable of some degree of effectiveness, particularly at frequencies above 100 KHz. In order to address noise contamination close in frequency to the 50-60 Hz power grid main, the filter components must be quite large and expensive. For this reason, solutions in this category that are price competitive for consumer use are only marginally effective.

In the case of the neutral line for AC power, the problem is made more difficult because of the need to avoid a ground fault. A ground fault is a condition in which the ground wire is carrying significant current. This condition is not acceptable by any existing electrical codes. One cannot therefore simply connect ground and neutral together, or tie them together through a large capacitor. For this reason, solutions in this category that are price competitive for consumer use are only marginally effective.

Power regenerators operate as one or more high voltage-high current amplifiers which amplify a 50-60 Hz signal source to the voltage of the utility power. When used in connection with neutral lines for AC power, these regenerators are often configured to produce balanced power. In balanced power the incoming AC is regenerated in split-voltage fashion, where half of the voltage is presented to the hot line and half to the neutral line. The neutral line is therefore treated by this approach.

In both cases—AC power and neutral lines for AC power—regenerators suffer from a low degree of energy efficiency typical of amplifiers, less than 50%. The problem is further compounded by the high degree of linearity that is required from the amplifier in order to avoid the regeneration of harmonic distortion. More sophisticated modes of amplifier operation are able to permit increased efficiency, but with exacerbated complexity and cost. While products in this category tend to be relatively effective, they are also known to be inefficient, heat producing, large, heavy, and expensive.

Power correctors operate by adding or subtracting a small voltage to the incoming AC voltage, to the right degree at each instant in time to correct the incoming voltage to a sine wave. Stated alternatively, the incoming voltage is represented as an error voltage added to a perfect sine wave. Power correctors evaluate the incoming AC, determine how much of the voltage is error, and subtract that error from the incoming voltage. The end result is an output waveform that is sinusoidal, devoid of the incoming spectral impurities. Power correctors have a fundamental advantage over regenerators in that they are not required to process the entire voltage waveform, only the error. For this reason, the amplifiers) involved operates on much lower voltage and the efficiency is proportionally increased.

In the case of AC power, practical realizations of power correctors have suffered from several limiting constraints centering on methods of subtracting the error from the incoming voltage. In one prior art solution, the method of subtracting the error involves the use of an isolation transformer that handles the entire AC power, resulting in a heavy and costly apparatus. In another solution, the error is subtracted through a small transformer in the AC current path. Such an approach has limited effectiveness because of the finite bandwidth of the transformer.

In the case of neutral lines for AC power, to the knowledge of the present inventor, power correctors have not previously included treatment of the neutral line for noise reduction by means other than the passive techniques described and listed above, except in the case of balanced power correctors.

In addition to the noise problems inherent in AC power lines and AC power neutral lines, direct current power supplies are plagued with noise from various sources. First, there is the noise coming in on the AC power grid, as described above. Second, there is the rectifier switching noise. Third, there is noise from the filter capacitors, transformer, and other passive components. Fourth, there is noise generated by active regulator circuits. Fifth, there is noise generated by the load circuit. There are no doubt other sources of noise.

Typically, power supply circuits treat these sources of noise with large filter capacitors aimed at "shorting out" the noise by bypassing it to ground. The effectiveness of this approach is quite limited because the finite effective series series resistance of the filter capacitors in combination with the relatively low source resistance of the power supply limits the possible noise attenuation. Sometimes a high quality film capacitor is placed in parallel with the electrolytic filler capacitor to improve (reduce) series resistance at high frequencies. While this certainly helps, it does not mitigate the underlying problem because sufficiently large capacitance values are impractical.

Other attempts to address the noise problem involve active voltage regulation circuits. Often this approach takes the form of inexpensive three-terminal integrated circuit regulators common in the industry. This approach improves noise levels in the lower part of the spectrum by compressing the noise against a voltage reference, such as a zener diode. The resultant reference voltage is then scaled and amplified by an operational amplifier and presented to the load. Unfortunately, the voltage reference produces significant unwanted noise. To make matters worse, the operational amplifier is normally setup to produce gain greater than unity so that it can produce the desired output voltage from a convenient value voltage reference, and this means that the reference noise is amplified before being presented to the load.

Common to many of the prior art solutions is a custom engineered approach which forbids implementation after the fad, but instead which requires power supply re-design in order to upgrade.

The prior art devices and circuits reflect the current state of the art of which the present inventor is aware. Reference to, and discussion of, this prior art is intended to aid in discharging Applicant's acknowledged duty of candor in disclosing information that may be relevant to the examination of claims to the present invention. However, it is respectfully submitted that none of the above-indicated prior art discloses, teaches, suggests, shows, or otherwise renders obvious, either singly or when considered in combination, the invention described and claimed herein.

BRIEF SUMMARY OF THE INVENTION

In a first preferred embodiment, the present invention solves the problem of unwanted noise in AC power by operating effectively as a power corrector. It subtracts error voltage without the need to use expensive or performance limiting transformers.

The noise reduction circuit for AC power has numerous advantages over the prior art. With regard to the most relevant examples of prior art (power correctors), the invention is superior to existing solutions in that it does not require a large transformer capable of handling the full voltage and current of the supplied AC power. Neither does the invention require that the error correction signal be coupled to the incoming AC power through a coupling transformer so as to limit the bandwidth of the correction. Rather, the invention operates by subtracting the error voltage directly from the incoming AC that has been boosted in voltage by a small boost transformer.

In a second preferred embodiment, the present invention solves the problem of unwanted noise in AC power neutral lines by operating effectively as a power corrector. The invention is superior to prior art techniques in that it effectively reduces unwanted noise on the neutral line at all frequencies without introducing unwanted current in the ground line. The invention avoids the efficiency problems and power transformer requirements of balanced power regenerators.

In a third preferred embodiment of the noise reduction circuit of the present invention, the problem of unwanted noise in DC power supplies is solved by greatly reducing the noise floor below what is achieved by prior solutions over a broad frequency range without adding substantially to system cost. The present invention is superior to the prior art method of relying on the filter capacitors to eliminate noise in that it is many times more effective. It is not undermined by the inherently low source impedance of the power supply, as the filter capacitor method is. It is also not undermined by the finite effective series resistance of large filter capacitors because it does not utilize them to achieve the additional level of noise reduction. The invention has advantages over the active circuit voltage regulator method of noise reduction because it does not present a biased zener diode or other noise generating device directly to the input of an operational amplifier.

A further advantage of the noise reduction circuit for DC power supplies is that it can be implemented in an existing power supply without any re-design of the existing circuit.

Yet a further advantage of noise reduction circuit for DC power supplies is that it can be added to a power supply of arbitrary output voltage without requiring a major re-design of the invention to meet the voltage requirements.

Finally, the noise reduction circuit for DC power supplies is superior to prior art solutions in that it can be used in conjunction with existing voltage regulator circuits without resulting in a change in output voltage of the power supply.

Other novel features which are characteristic of the invention, as to organization and method of operation, together with further objects and advantages thereof will be better understood from the following description considered in connection with the accompanying drawings, in which preferred embodiments of the invention are illustrated by way of example. It is to be expressly understood, however, that the drawings are for illustration and description only and are not intended as a definition of the limits of the invention. The various features of novelty which characterize the invention are pointed out with particularity in the claims annexed to and forming part of this disclosure. The invention resides not in any one of these features taken alone, but rather in the particular combination of all of its structures for the functions specified.

The foregoing summary broadly sets out the more important features of the present invention so that the detailed description that follows may be better understood, and so that the present contributions to the art may be better appreciated. There are additional features of the invention that will be described in the detailed description of the preferred embodiments of the invention which will form the subject matter of the claims appended hereto.

Accordingly, before explaining the preferred embodiment of the disclosure in detail, it is to be understood that the disclosure is not limited in its application to the details of the construction and the arrangements set forth in the following description or illustrated in the drawings. The inventive apparatus described herein is capable of other embodiments and of being practiced and carried out in various ways.

Also, it is to be understood that the terminology and phraseology employed herein are for descriptive purposes only, and not limitation. Where specific dimensional and material specifications have been included or omitted from the specification or the claims, or both, it is to be understood that the same are not to be incorporated into the appended claims.

As such, those skilled in the art will appreciate that the conception, upon which this disclosure is based may readily be used as a basis for designing other structures, methods, and systems for carrying out the several purposes of the present invention. It is important, therefore, that the claims are regarded as including such equivalent constructions as far as they do not depart from the spirit and scope of the present invention. Rather, the fundamental aspects of the invention, along with the various features and structures that characterize the invention, are pointed out with particularity in the claims annexed to and forming a part of this disclosure. For a better understanding of the present invention, its advantages and the specific objects attained by its uses, reference should be made to the accompanying drawings and descriptive matter in which there are illustrated the preferred embodiment.

BRIEF DESCRIPTION OF THE SEVERAL VIEWS OF THE DRAWINGS

The invention will be better understood and objects other than those set forth above will become apparent when consideration is given to the following detailed description thereof. Such description makes reference to the annexed drawings wherein.

DETAILED DESCRIPTION OF THE INVENTION

Figure 7:
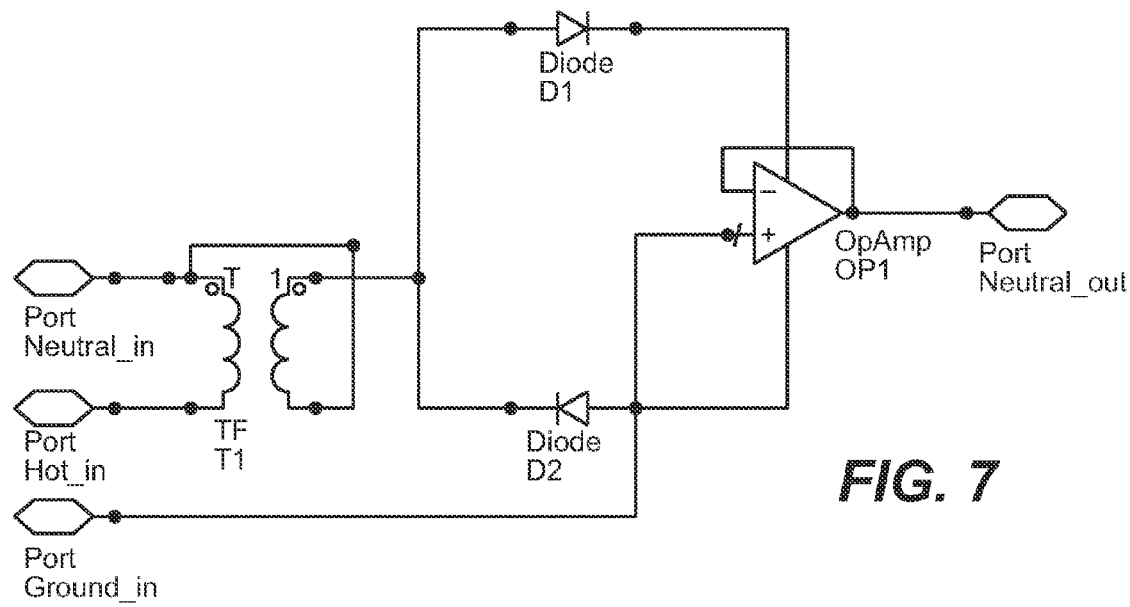
FIG. 7 is a circuit diagram of an embodiment of the invention, wherein filtering of the neutral line of balanced alternating current (AC) power is accomplished through a power correcting arrangement.
Figure 8:
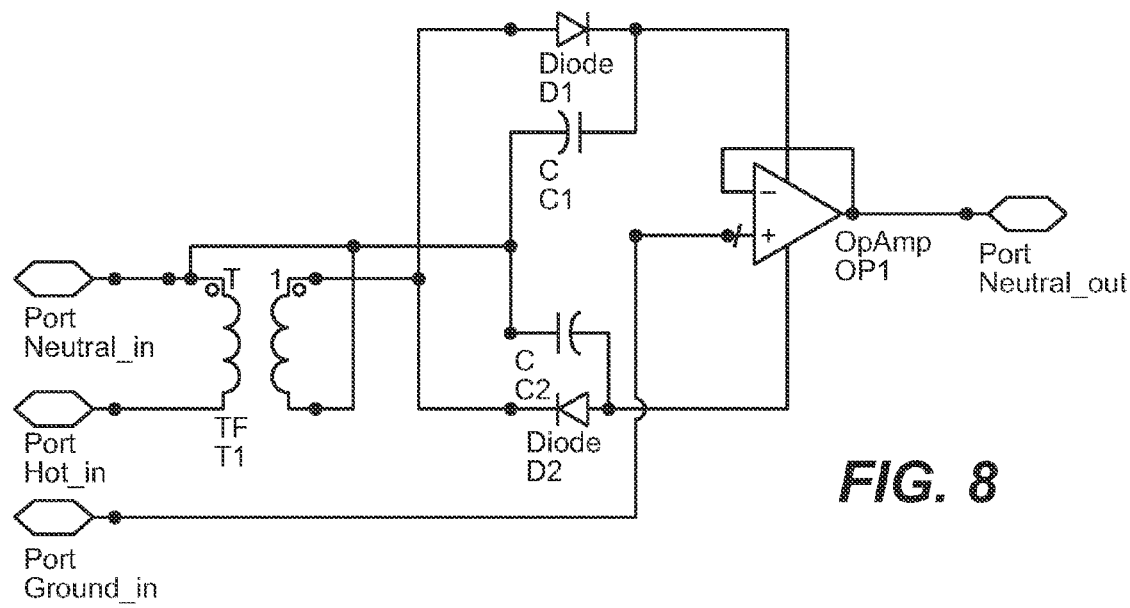
FIG. 8 is a circuit diagram of an improved embodiment of the power correcting arrangement shown in FIG. 7, wherein filtering capacitors are also incorporated into the circuit.
Figure 9B:
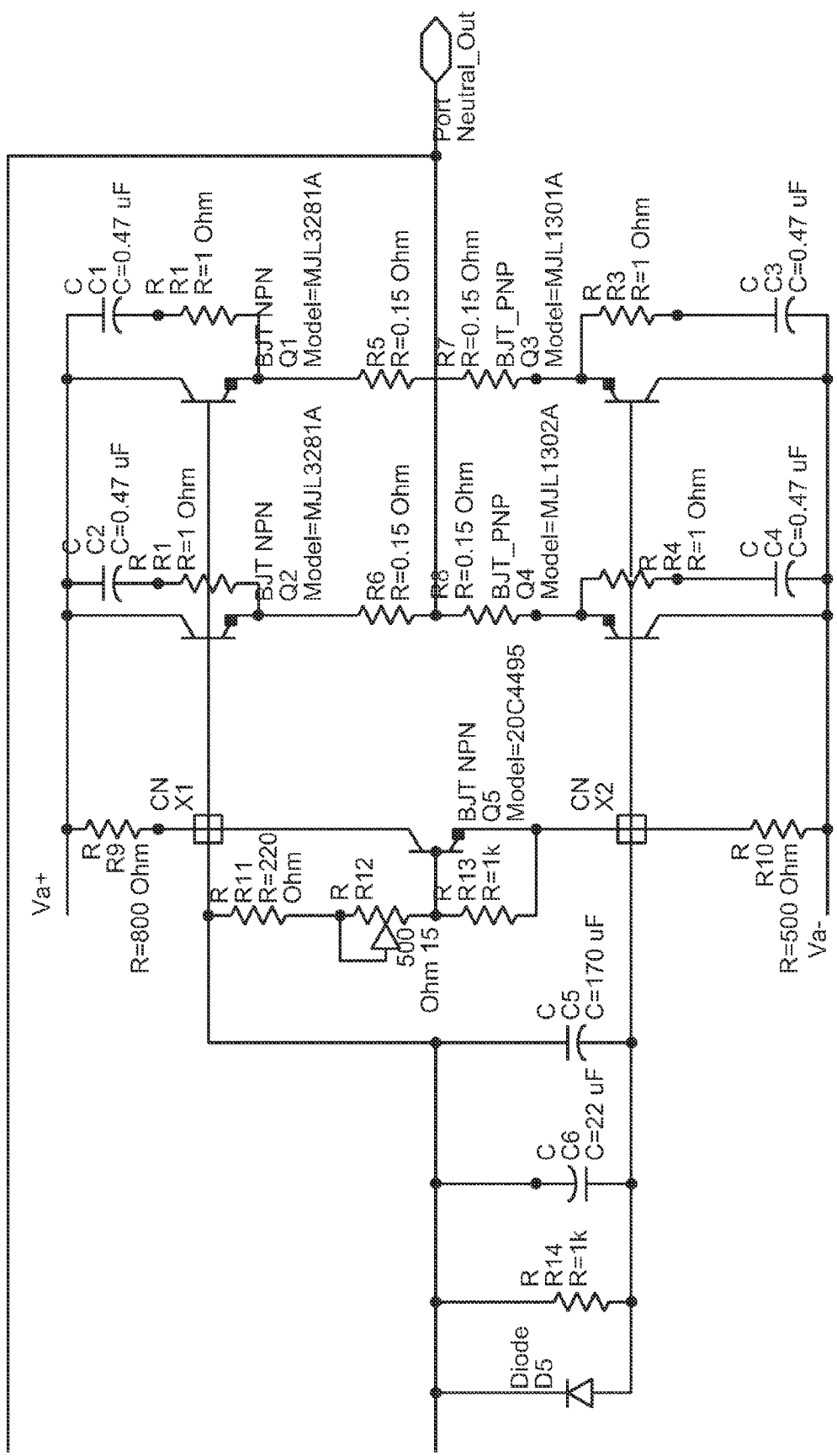
FIG. 9 is a detailed circuit diagram of a preferred embodiment of the invention, wherein a final stage is added that has higher current handling than the operational amplifier used for filtering, and additional circuitry provides pre-filtering and internal circuit stabilization and protection.

Referring to FIGS. 1 through 26, wherein like reference numerals refer to like components in the various views, FIGS. 1-6 show a noise reduction circuit for AC power; FIGS. 7-9 show a second preferred embodiment adapted for use in reducing noise in AC power neutral lines; and FIGS. 10-26 show a third preferred embodiment adapted for use in reducing noise in DC power supplies.

Figure 1:
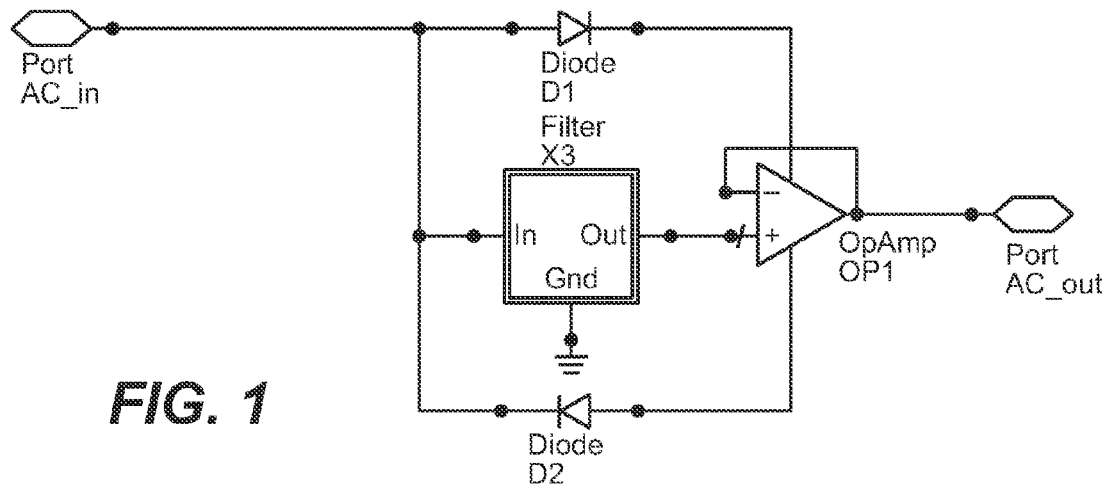
FIG. 1 is a simplified block circuit diagram of first preferred embodiment of the invention, wherein filtering of alternating current (AC) power is accomplished through a power correcting arrangement.

The invention is depicted in its most general conceptual form in FIG. 1. AC_in represents a voltage that contains noise. It is presented to the input of a filter X3 which filters the noise from the voltage. The noise filtered voltage is then used to bias the non-inverting input of operational amplifier OP1. OP1 is configured as a unity gain buffer so that the noise filtered voltage from X3 is forced onto the load at the output AC_out. Diodes D1 and D2 direct the AC current through the amplifier so that it is correctly biased during each half-cycle of the AC. In this example the filter must have some attenuation at the fundamental frequency of the incoming AC so that the amplifier drop-out voltage and the error voltage can be accommodated.

An important point to make here is that the filter reference node is set to ground. It is presumed that ground is the reference voltage with respect to which one is interested in lowering the noise content of input voltage AC_in. If this is not the case, one needs only to ground the filter to the circuit node with respect to which the supply voltage noise is deemed to be important.

In practice it is often required that the apparatus not introduce a voltage drop. This requirement is accommodated by way of a small boost transformer, shown in FIG. 2. The purpose of transformer T1 is to boost the incoming AC voltage just enough to provide for the amplifier drop-out voltage and for the amount of voltage correction that is required to eliminate the error voltage. Typical amplifier drop-out voltage is 3 V, while typical AC power line error voltage in the United States is 15 Vpeak. Allowing 1 V drop-out in the rectifier diodes, one would require at least 19 Vpeak voltage boost from the transformer, or about 13.5 VRMS. Practical considerations suggest the need for some margin; hence the transformer may be rated for 15-18 V. For 20 A capability the transformer would be required to pass 20 A.

In the foregoing examples the amplifier is an operational amplifier typical in the industry; except that it is equipped to pass the entire load current of whatever electric appliance is connected to the load. The voltage capability of the amplifier need not be extraordinary, since it is only required to handle the relatively small error voltage. Notwithstanding, more exotic amplifier modes of operation can be used equally well to further improve efficiency, such as the class D amplifier.

Figure 3:
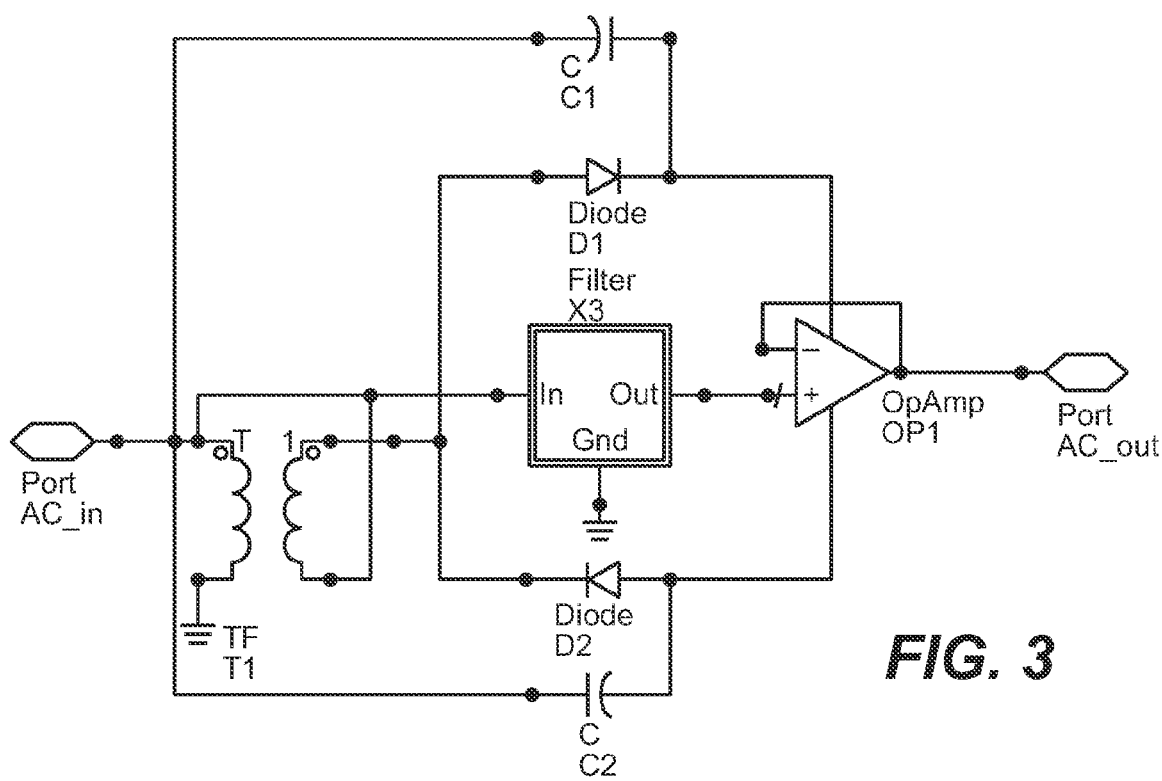
FIG. 3 is a simplified block circuit diagram of an improved embodiment of the power correcting arrangement shown in FIG. 2, wherein filtering capacitors are also incorporated into the circuit.

In practical application, the amplifier would benefit from the use of filter capacitors on the supply rails, and the implementation of these is shown in FIG. 3.

Figure 4:
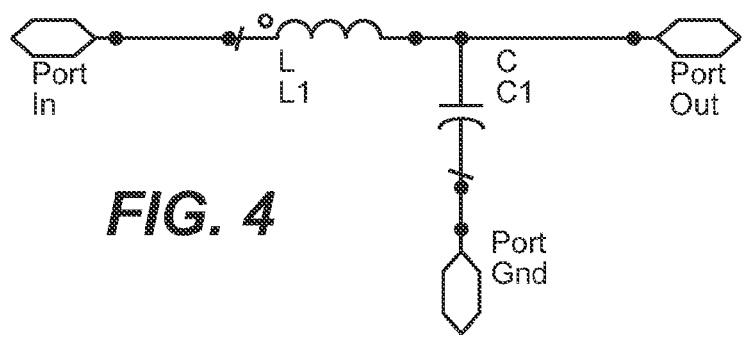
FIG. 4 is a detailed circuit diagram of an embodiment of the filter block X3 shown in FIG. 1, FIG. 2 and FIG. 3.

The filter could be a passive or active type. In either case, the voltage supplied to the amplifier input must be that which is required at the output. For this reason, an economical approach is to use a passive filter, such as the one shown in FIG. 4. Numerous variations and embellishments on the simple example of FIG. 4 are certainly possible, depending on the attenuation characteristics that are desired. A key point is that the filter, whatever its form, does not have to supply significant current. For this reason, the cost of the filter can be kept quite low with desirable levels of noise attenuation.

Another key point is that the filter must be phase conservative at the fundamental frequency. For example, in the United States the power line frequency is 60 Hz. The filter must not have significant throughput phase shift at 60 Hz. If this requirement is not met, the amplifier would be called upon to handle undue voltage levels and the efficiency of the system would drop dramatically.

Figure 5:
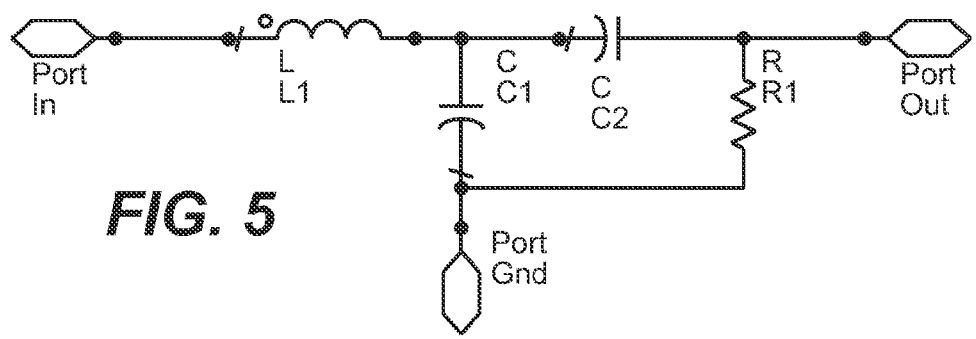
FIG. 5 is a detailed circuit diagram of an embodiment of the filter block X3 shown in FIG. 1, FIG. 2 and FIG. 3, wherein a phase lead is introduced.

When large amounts of attenuation are required near the fundamental frequency, the filter will certainly produce a phase lag at the fundamental frequency. In this case a phase lead network can be added to restore the original phase of the incoming AC, as shown in FIG. 5.

Numerous active filter techniques can also be used to provide the filtering and also the phase correction. These circuits will not be discussed here because they are not the topic of the disclosure.

Operational amplifiers are usually designed with lower current levels in mind, hence an output stage can be added to a traditional amplifier to equip it for the higher current levels often required at the AC power interface. This and other practical concerns are addressed in the preferred embodiment depicted in FIG. 6.

Figure 6D:
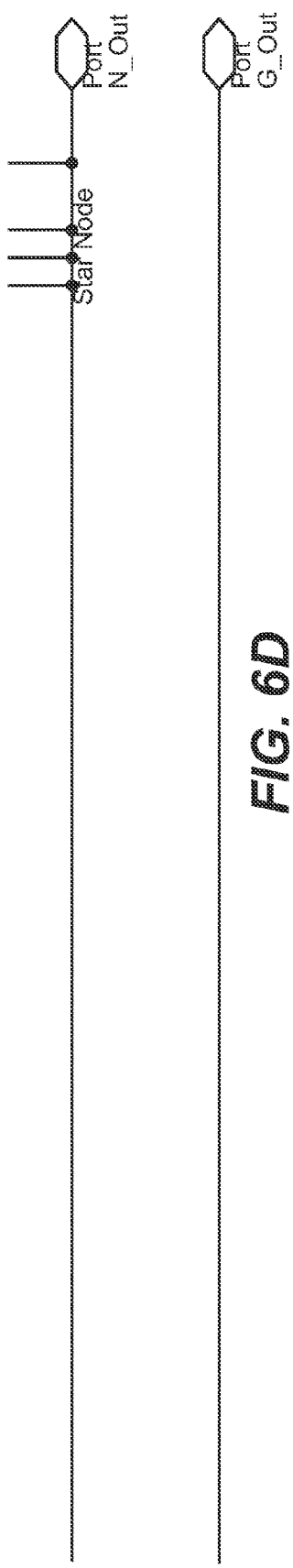
FIG. 6 is a detailed circuit diagram of a preferred embodiment of the invention, wherein a final stage is added that has higher current handling than the operational amplifier used for filtering, and additional circuitry provides pre-filtering, phase adjustment and internal circuit stabilization and protection.
Figure 6:
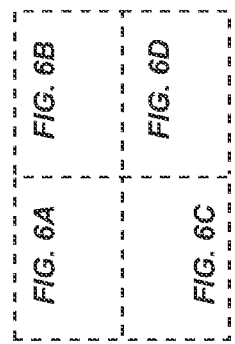
Figure 6A:
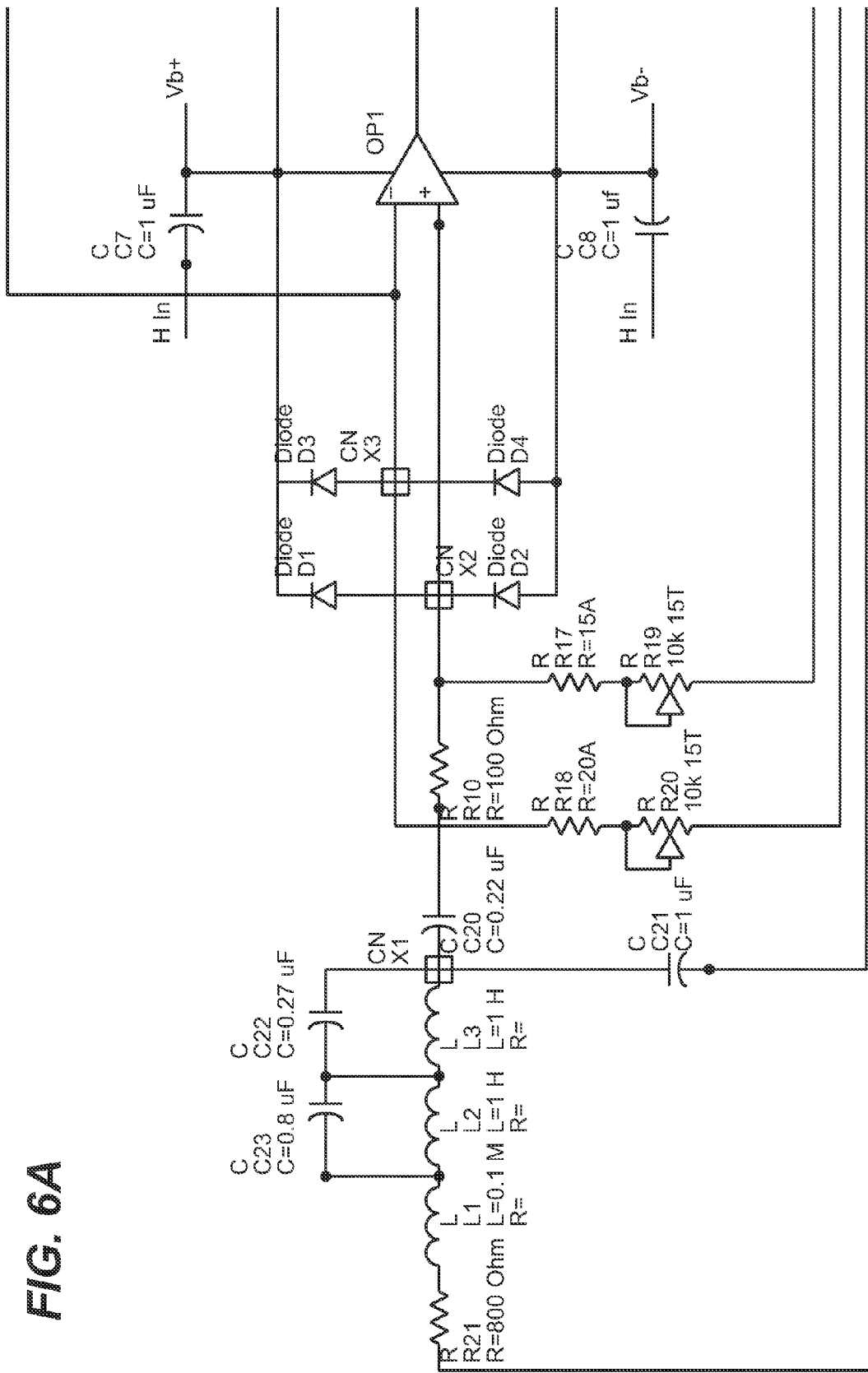
Figure 6B:
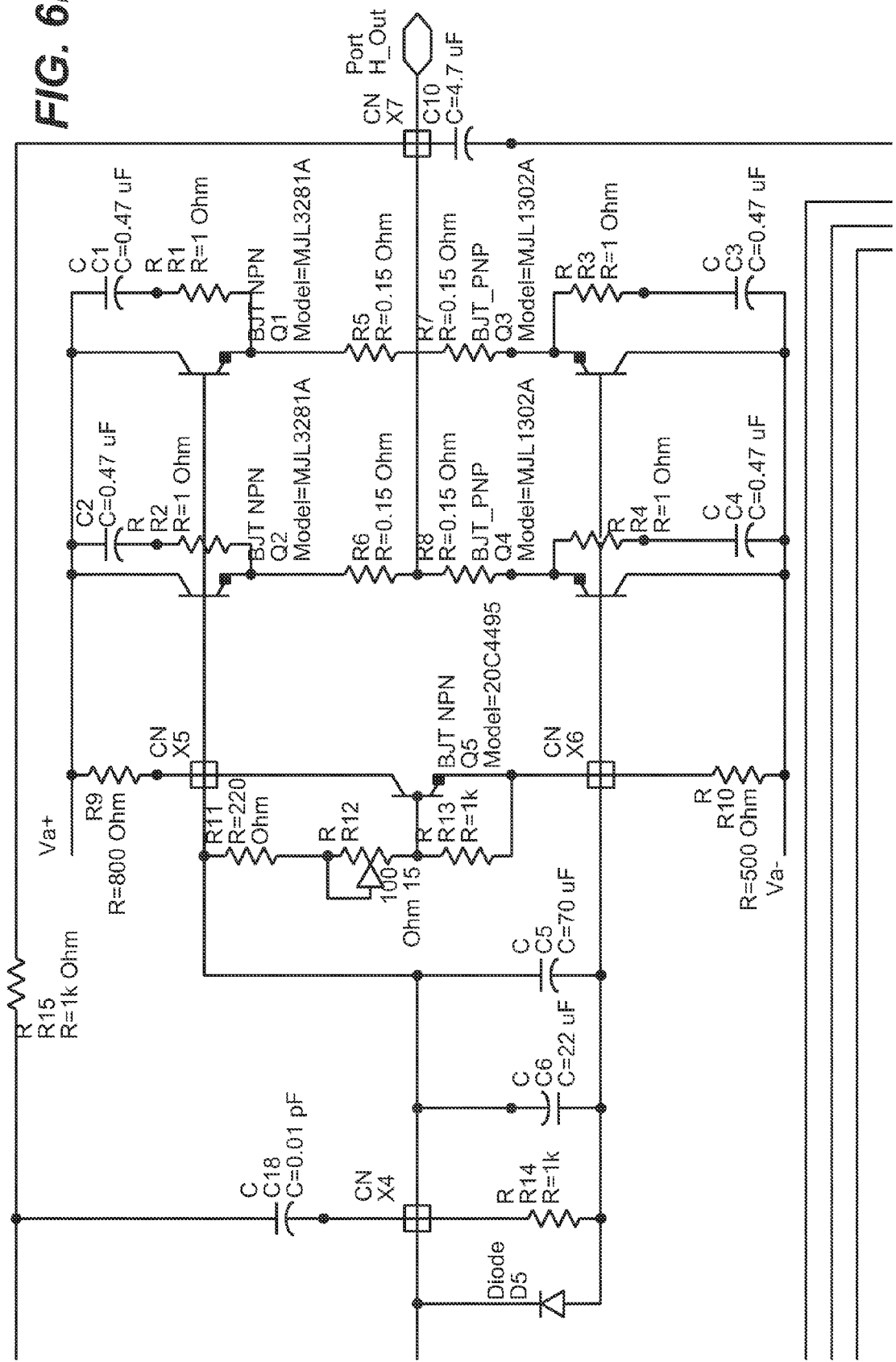
Figure 6C:
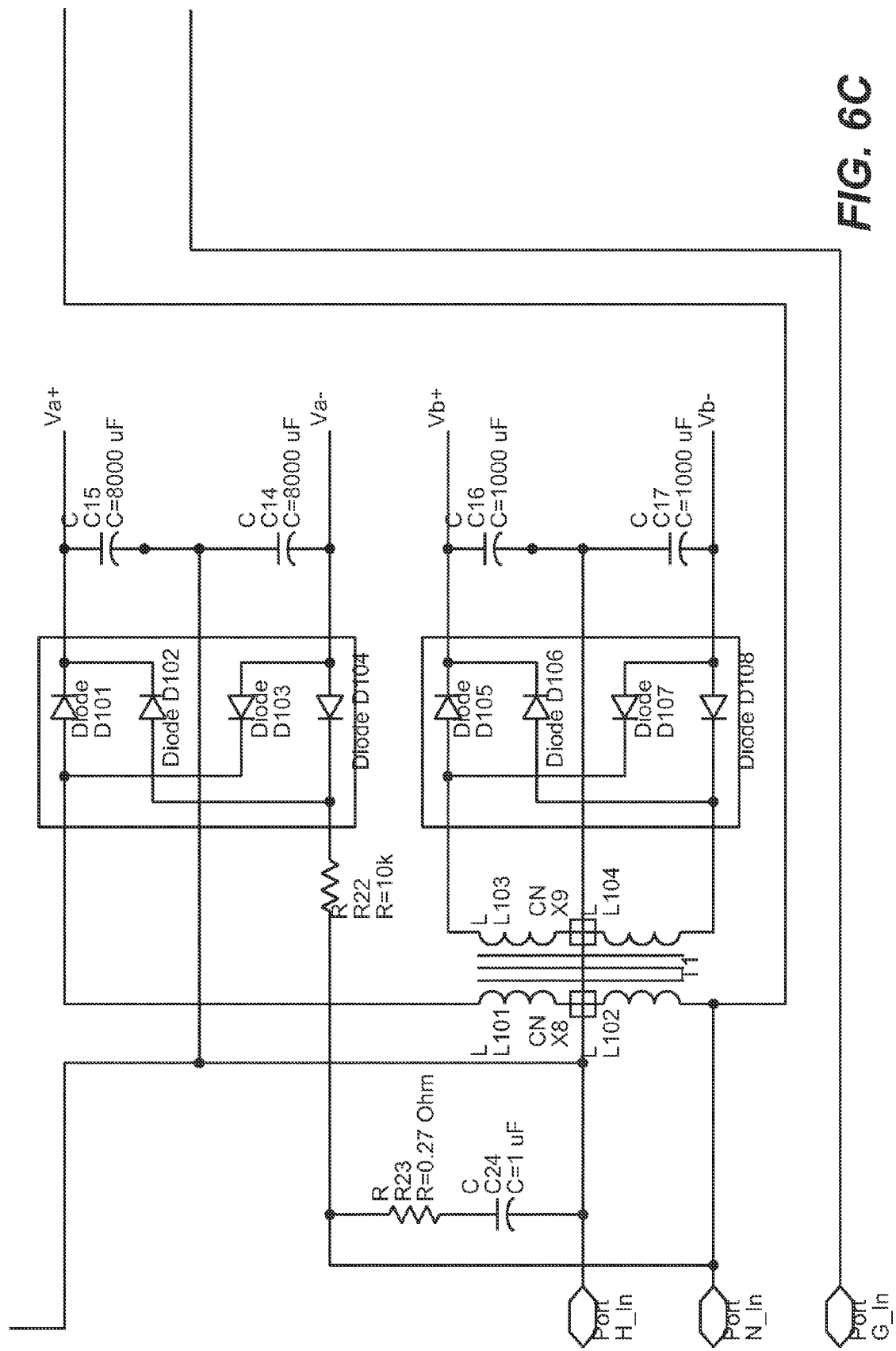

According to FIG. 6 the current capability of the operational amplifier LM4701 is augmented by the bipolar output stage that follows. Most of this circuitry is common to the art and will therefore not be described in detail. C1-C4 and R1-R4 comprise series RC networks, referred to in the art as Zobel networks, and are used to help stabilize the amplifier under a variety of possible load conditions. C18 provides high frequency feedback directly around the operational amplifier for improved high frequency stability. C10 helps filter high frequency noise that is beyond the bandwidth of the amplifier, while also contributing to the stability of the system under various load conditions. R15, R18, and R20 are used to provide a gain trim so that the magnitude of the incoming fundamental frequency voltage will be conserved at the output. C20, R17, and R19 provide an adjustable phase correction. Diodes D1-D4 provide input protection by keeping the operational amplifier inputs between the supply rails at all times. R10 allows voltage from C20 and C21 to drop when either D1 or D2 are in conduction during input protection. R21, L1-L3, and C21-C23 form a passive low pass filter with 3rd and 5th harmonic traps.

Two power supplies are present: Va and Vb. The Vb supply is slightly higher voltage than the Va supply, and is needed only when the drop-out voltage of the operational amplifier is larger than that of the output stage. T1 is an isolation stepdown transformer for the Vb supply and is also an autotransformer for the Va supply. R22 is used to supply current to the filter capacitors C14 and C15 during off-cycle times, which helps pre-charge the capacitors before the next drain cycle. R23 and C24 are used to bypass the AC line so that a predictable impedance is seen across the line at high frequencies, regardless of outside conditions. This measure is again for stability reasons.

Now considering the figures in order, and referring first to FIG. 1, there is shown a simplified schematic block diagram of a version of the present invention, wherein filtering of alternating current (AC) power is accomplished through a power correcting arrangement.

In FIG. 1, port AC_in is where an AC power signal is received. The received AC power signal is applied in parallel to diodes D1 and D2; as well as to the In port of filter block X3. Diode D1 passes the positive portion of the received signal to the positive power source input pin of operational amplifier OP1. Diode D2 passes the negative portion of the received signal to the negative power source input pin of operational amplifier OP1.

Operational amplifier OP1 is configured as a non-inverting unity gain buffer amplifier (note that the output of operational amplifier OP1 is connected directly to the inverting input of operational amplifier OP1). Filter block X3 filters the noise from the received signal voltage. The output of filter block X3 is used to bias non-inverting input of operational amplifier OP1. In this configuration, filter block X3 must have at least some attenuation at the fundamental frequency of the received AC power signal in order to accommodate the drop out voltage of operational amplifier OP1 in addition to the maximum error voltage present on the received AC power signal. Operational amplifier OP1 amplifies the filtered output of filter block X3, applying the filtered and amplified signal to port AC_out. In this manner, the input AC power voltage is filtered, and the filtered version of the signal is passed via port AC_out to the load circuits.

Figure 2:
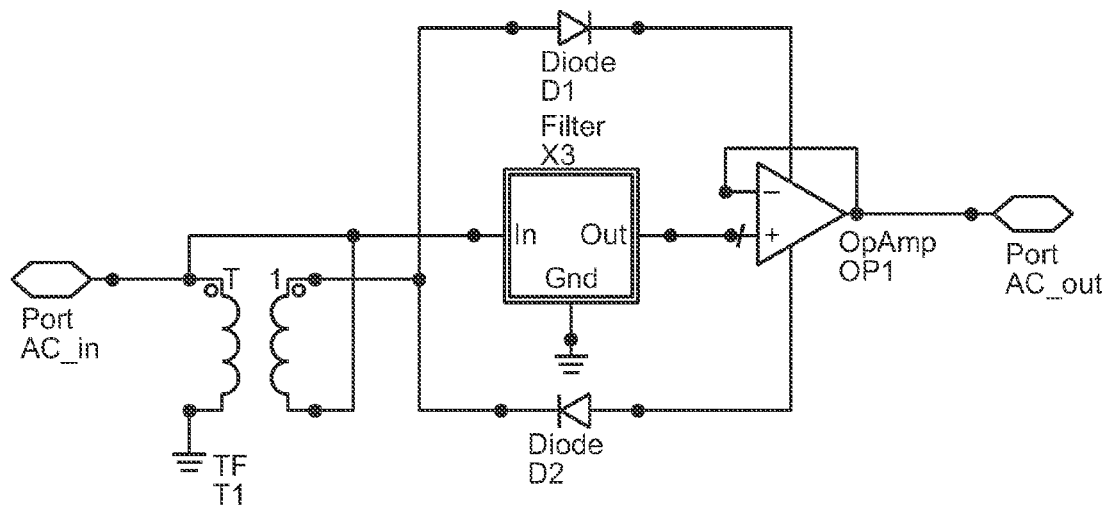
FIG. 2 is a simplified block circuit diagram of an improved embodiment of the power correcting arrangement shown in FIG. 1, wherein a small boost transformer is also incorporated into the circuit.

Referring next to FIG. 2, there is shown a simplified block circuit diagram of an improved embodiment of the power correcting arrangement shown in FIG. 1, wherein transformer T1 is also incorporated into the circuit. In this embodiment, transformer T1 provides a voltage boost to the received AC power signal. In this embodiment it can be seen that the received AC power signal is applied directly to port In of filter block X3 in parallel with the application of the same signal to the primary and secondary windings of transformer T1. The secondary winding of transformer T1 is connected in parallel to diodes D1 and D2. The stepped-up voltage provided by the transformer overcomes the voltage drop introduced by diodes D1 and D2, and the drop out voltage of operational amplifier OP1, as well as the maximum error voltage present on the received AC power signal.

Referring to FIG. 3, there is shown a simplified block circuit diagram of an improved embodiment of the power correcting arrangement shown in FIG. 2, wherein filtering capacitors are also incorporated into the circuit. In this embodiment, capacitors C1 and C2 provide energy storage for maintaining bias conditions on operational amplifier OP1 during all times of the incoming AC cycle.

Referring to FIG. 4, there is shown a detailed circuit diagram of an embodiment of the filter block X3 shown in FIG. 1, FIG. 2 and FIG. 3. In this embodiment, a circuit comprised of series inductor L1 (connected directly between port In and port Out of filter block X3) and parallel capacitor C1 (connected directly between port Gnd and port Out of filter block X3) provides a low pass filter arrangement.

Referring next to FIG. 5, there is shown a detailed circuit diagram of an embodiment of the filter block X3 shown in FIG. 1, FIG. 2 and FIG. 3, wherein a phase lead is introduced. In this embodiment, filter block X3 is comprised of series inductor L1 (connected directly between port In and the signal input of capacitor C2). The signal output of capacitor C2 is connected directly to port Out of filter block X3. Parallel capacitor C1 (connected directly between port Gnd and the junction of inductor L1 and capacitor C2). Resistor R1 is connected directly between port Out of filter block X3 and port Gnd of filter block X3. This arrangement provides a low pass filter arrangement that prevents an unacceptable phase lag introduced by the filter circuitry when large amounts of attenuation are required at the fundamental frequency of the received AC power signal.

Referring finally to FIG. 6, there is shown a detailed circuit diagram of a preferred embodiment of the invention, wherein, a final stage is added, post-filter stage, that has higher current handling than the operational amplifier used for filtering, and additional circuitry provides pre-filtering, phase adjustment and internal circuit stabilization and protection.

In this embodiment of the present invention, Port H_in is where the hot leg of the AC power source is connected to the invention. Port N_in is where the neutral leg of the AC power source is connected to the invention. Port N_in is connected to port N_out, passing the neutral leg directly to the system load. Port G_in is where the ground leg of the AC power source is connected to the invention. Port G_in is connected to port G_out, passing the ground leg directly to the system load. Resistor R23 and capacitor C24 are used as an RC network applied across the hot and neutral legs of the balanced AC power source. This configuration creates predictable circuit input impedance at high frequencies.

The hot and neutral legs of the AC power source are applied to the inputs of the two simple power supplies Va and Vb. The output voltage of power supply Vb is slightly higher than that of power supply Va, and is only used when the dropout voltage of operational amplifier OP1 is larger than that of the final output stage.

Transformer T1 is an isolation step-down transformer for the input of power supply Vb. Transformer T1 also acts as an autotransformer for the input of power supply Va. Resistor R22 is used to supply current to filter capacitors C14 and C15 during off-cycle times.

The power supply voltage present at port H_in is routed to the non-inverting input pin of operational amplifier OP1 via the low-pass filter network comprised of resistor R21, inductors L1, L2 and L3, capacitors C21, C22 and C23, and then through resistor R10. Resistor R10 allows voltage from capacitors C20 and C21 to drop when either diode D2 or D2 are in conduction during an input protection condition. Diodes D1, D2, D3 and D4 provide input protection by keeping the inputs of operational amplifier OP1 between the supply rails at all times. Resistors R15, R18 and R20 are used to provide a gain trim so that the magnitude of the incoming fundamental frequency voltage is conserved at port V_out. Capacitor C20, in combination with resistors R17 and R19 provide an adjustable phase correction.

Operational amplifier OP1, and its surrounding circuitry operate as described in the earlier figures. Capacitor C18 provides high frequency feedback around operational amplifier OP1 for increased stability in the presence of high frequencies. The output of operational amplifier OP1 is coupled to the final output stage (onto the bases of transistors Q1 through Q4).

Transistors Q1 through Q5 (along with their supporting components) comprise a bipolar output load driving stage capable of handling a significantly larger current throughput than operational amplifier OP1 can handle. Capacitors C1, C2, C3 and C4, in combination with resistors R1, R2, R3 and R4 provide stability for this final output stage under varying load conditions. Capacitor C10 (connected directly between port H_out and port N_out) helps filter high frequency noise that is beyond the bandwidth of the amplifier. The output of this final output stage is connected to port H_out, thereby providing the output voltage and current to the external load circuit.

FIGS. 7-9 show a second preferred embodiment of the present invention, this iteration specifically adapted for use in reducing noise in AC power neutral lines. The invention is depicted in its most general conceptual form in FIG. 7. Neutral_in represents a voltage that contains noise with respect to Ground. The non-inverting input of operational amplifier OP1 is referenced to Ground_in. OP1 is configured as a unity gain buffer so that the voltage from Ground_in is forced onto the neutral line at Neutral_out. Diodes D1 and D2 direct the AC current through the amplifier so that it is correctly biased during each half-cycle of the AC.

The purpose of transformer T1 is to provide enough voltage to operate the amplifier, provide for the drop-out voltage, and for the amount of voltage correction that is required, to eliminate the error voltage. Typical amplifier drop-out voltage is 3 V, while typical neutral line error voltage in the United States is 2 Vpeak. Allowing 1 V drop-out in the rectifier diodes, one would require at least 6 Vpeak voltage boost from the transformer, or about 4.2 V RMS. Practical considerations suggest the need for some margin; hence the transformer may be rated for 6 V. For 20 A capability the transformer would be required to pass 20 A.

In the foregoing examples the amplifier is an operational amplifier typical in the industry; except that it is equipped to pass the entire load current of whatever electric appliance is connected to the load. The voltage capability of the amplifier need not be extraordinary, since it is only required to handle the relatively small error voltage. Notwithstanding, more exotic amplifier modes of operation can be used equally well to further improve efficiency, such as the class D amplifier.

In practical application, the amplifier would benefit from the use of filter capacitors on the supply rails, and the implementation of these is shown in FIG. 8.

Operation amplifiers are usually designed with lower current levels in mind, hence an output stage can be added to a traditional amplifier to equip it for the higher current levels often required at the AC power interface. An example of this is depicted in FIG. 9.

According to FIG. 9 the current capability of the operational amplifier LM4701 is augmented by the bipolar output stage that follows. Most of this circuitry is common to the art and will therefore not be described in detail. C1-C4 and R1-R4 comprise series RC networks, referred to in the art as Zobel networks, and are used to help stabilize the amplifier under a variety of possible load conditions.

Two power supplies are present: Va and Vb. The Vb supply is slightly higher voltage than the Va supply, and is needed only when the drop-out voltage of the operational amplifier is larger than that of the output stage. T1 is an isolation step-down transformer for the Vb supply and is also an autotransformer for the Va supply.

Again, considering the drawings in order, and referring first to FIG. 7, there is shown a circuit diagram of an embodiment of the invention, wherein filtering of the neutral line of alternating current (AC) power is accomplished through a power correcting arrangement.

It can be seen that the neutral leg of a AC power input signal is applied via port Neutral_In to the top of the primary winding of transformer T1 in parallel with the bottom of the secondary winding of transformer T1. The bottom of the primary winding of transformer T1 is connected to port Hot_In, where the hot lead of the AC power input is connected. The top of the secondary winding of transformer T1 is connected in parallel to diodes D1 and D2. Transformer T1 steps up the input voltage to accommodate for voltage drops across diodes D1 and D2 as well to accommodate the maximum error voltage present on the neutral leg of the AC power. Additionally, the stepped-up voltage accommodates the drop out voltage of operational amplifier OP1.

Diode D1 passes the positive portion of the received signal to the positive power source input pin of operational amplifier OP1. Diode D2 passes the negative portion of the received signal to the negative power source input pin of operational amplifier OP1.

Operational amplifier OP1 is configured as a non-inverting unity gain buffer amplifier (note that the output of operational amplifier OP1 is connected directly to the inverting input of operational amplifier OP1).

The ground leg of the AC power input is connected to port Ground_In. Port Ground_In is connected directly to the non-inverting input of operational amplifier OP1. This applies the quiet reference voltage on the incoming ground wire to the non-inverting input of operational amplifier OP1. This voltage is amplified by operational amplifier OP1 and applied directly to port Neutral_Out. Port Neutral_Out is connected to the system load as the filtered neutral leg of the AC power. In this manner, there is no difference between the voltage between the output neutral leg and the ground leg of the AC power.

Referring now to FIG. 8, there is shown a circuit diagram of an improved embodiment of the power correcting arrangement shown in FIG. 7, wherein filtering capacitors C1 and C2 are also incorporated into the circuit. In this embodiment, the invention operates as described for FIG. 1; with capacitor C1 connected between the positive power input pin of operational amplifier OP1 and the non-inverting input pin of operational amplifier OP1, and capacitor C2 connected between the negative power input pin of operational amplifier OP1 and the Neutral_in input connection. This arrangement supplies bias voltage for the operational amplifier at all times of the incoming AC cycle.

Referring now to FIG. 9, there is shown a detailed circuit diagram of a preferred embodiment of the invention, wherein a final stage is added that has higher current handling than the operational amplifier used for filtering, and additional circuitry provides pre-filtering and internal circuit stabilization and protection.

In this embodiment of the present invention, Port H_in is where the hot leg of the AC power source is connected to the invention. Port N_in is where the neutral leg of the AC power source is connected to the invention (this is the leg that will be filtered, removing the noise present on the neutral leg with respect to port G_In). Port G_in is where the ground leg of the AC power source is connected to the invention. Port G_in is connected directly to the non-inverting input pin of operational amplifier OP1.

The hot and neutral legs of the AC power source are applied to the inputs of the two simple power supplies Va and Vb. The output voltage of power supply Vb is slightly higher than that of power supply Va, and is only used when the dropout voltage of operational amplifier OP1 is larger than that of the final output stage.

Transformer T1 is an isolation step-down transformer for the input of power supply Vb. Transformer T1 also acts as an autotransformer for the input of power supply Va.

Operational amplifier OP1, and its surrounding circuitry operate as described in the earlier figures. The output of operational amplifier OP1 is coupled to the final output stage (onto the bases of PNP transistors Q1 through Q5).

PNP transistors Q1 through Q5 (along with heir supporting components) comprise a bipolar output load driving stage capable of handling a significantly larger current throughput than operational amplifier OP1 can handle. Capacitors C1, C2, C3 and C4, in combination with resistors R1, R2, R3 and R4 provide stability for this final output stage under varying load conditions. The output of this final output stage is connected to port Neutral_out, thereby providing a neutral line that is filtered of noise with respect to port G_In.

Finally, FIGS. 10-26 show a third preferred embodiment of the present invention, this iteration specifically adapted for use in reducing noise in DC power supplies. This iteration is depicted in its most general form in FIG. 10. Vint represents a voltage that contains noise. It is presented to the input of a low pass filter X3 which filters the noise from the voltage. The noise filtered voltage is then used to bias the non-inverting input of operational amplifier OPI. OP1 is configured as a unity gain buffer so that the noise filtered voltage from X3 is forced onto the load at the output Vout. Vin1 and Vin3 are the rail supply voltages for OPI and are set so that Vin1-Vin3 is sufficient to operate the amplifier. A further constraint is that Vin1>Vin2>Vin3, so that OPI can generate the desired output voltage (Vint-Vnoise) without exceeding its available operating voltage.

An important point to make here is that the filter reference node is set to ground. It is presumed that ground is the reference voltage with respect to which one is interested in lowering the noise content of input voltage Vin1. If this is not the case, one needs only to ground the filter to the circuit node with respect to which the supply voltage noise is deemed to be important.

Figure 11:
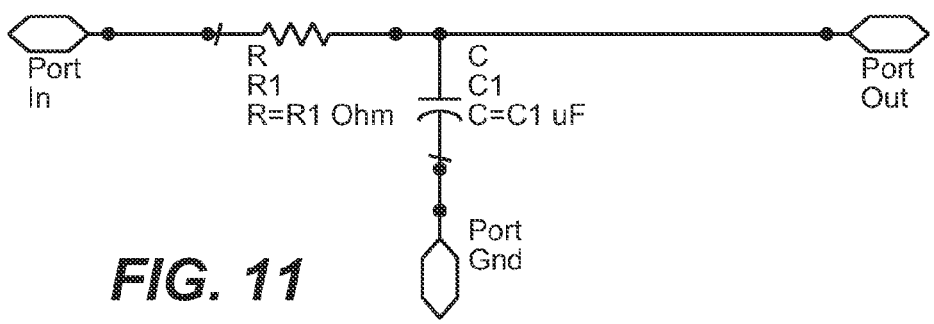
FIG. 11 is a detailed circuit diagram of a preferred embodiment of the filter block X3 shown in FIG. 10.

A preferred embodiment of the filter is shown in FIG. 11. A more dramatic noise reduction profile with frequency is obtained by using the filter of FIG. 12.

Figure 13:
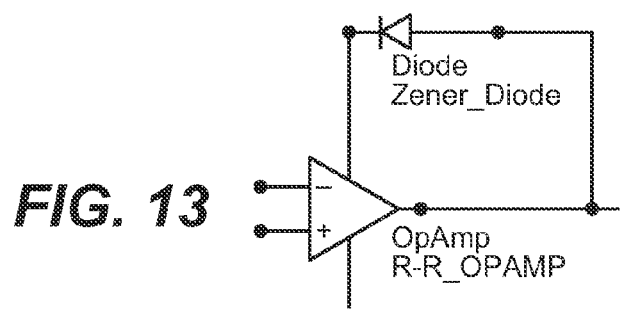
FIG. 13 is a circuit diagram of a preferred embodiment of operational amplifier OP1 shown in FIG. 10.

A preferred embodiment of the operational amplifier is shown in FIG. 13. The diagram shows an opamp of the rail-to-rail variety, which is useful in applications where minimizing dropout voltage is important. The zener diode is used to prevent the output node from falling below the lower supply rail during start-up. The latter condition can cause some amplifier designs to latch up.

Figure 10:
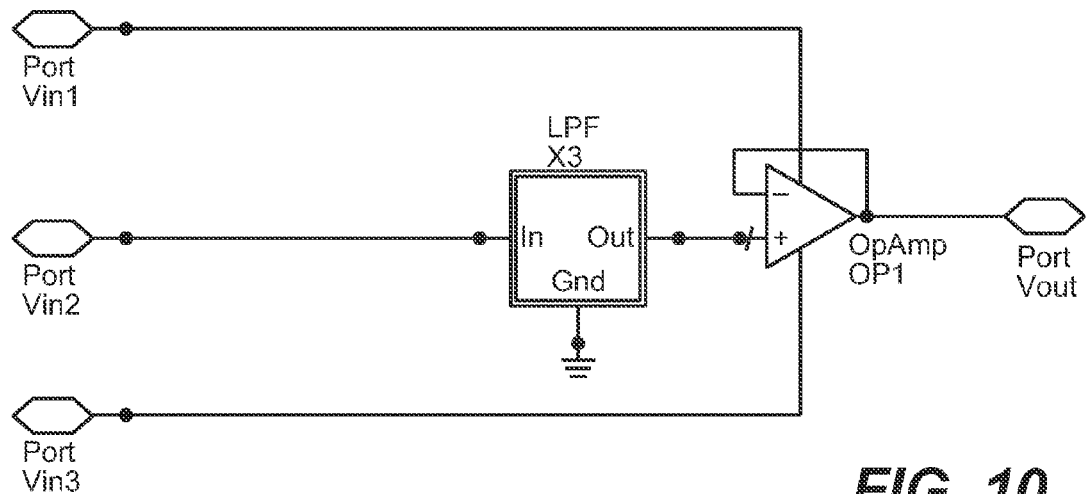
FIG. 10 is a simplified block circuit diagram of an embodiment of the invention, wherein filtering of direct current (DC) power is accomplished through a power correcting arrangement.
Figure 14:
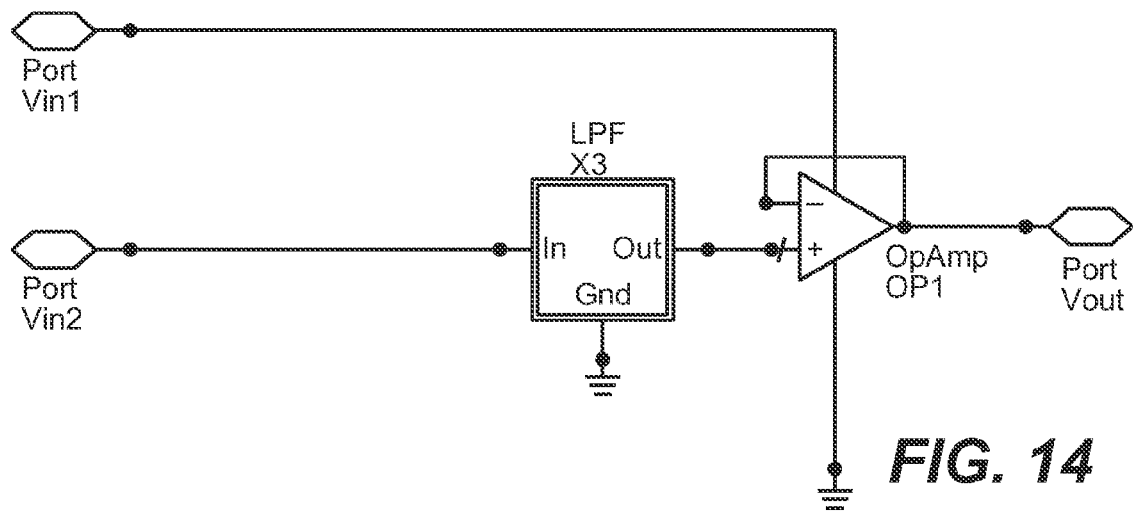
FIG. 14 is a simplified block circuit diagram of an embodiment of the invention, wherein filtering of direct current (DC) power is accomplished through a power correcting arrangement, and wherein the lower rail voltage of operational amplifier OP1 is identical to the system ground.

A special case of the circuit in FIG. 10 can be seen in FIG. 14. In this case the lower rail voltage of the operational amplifier is identical to the system ground.

In many cases it is convenient to take the reference voltage from the same supply that feeds the operational amplifier rail. This can be accomplished with the circuit depicted in FIG. 15. In this case the reference voltage is obtained from the Vin1 voltage by passing it through a level shifter X2. The purpose of the level shifter is to keep the reference voltage within the supply rails of the amplifier. In the case that minimum dropout voltage is required, the level shifter is setup to provide a reference voltage that is just slightly below the value of Vin1. The specific value of drop required depends on the dropout characteristics of the opamp, and on what amplitude of noise and ripple exists on the Vin1 voltage.

Figure 16:
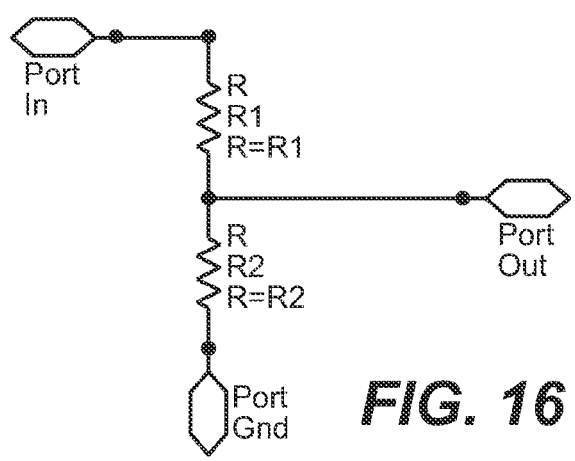
FIG. 16 is a detailed circuit diagram of a simple embodiment of level shifter block X2 shown in FIG. 15.
Figure 17:
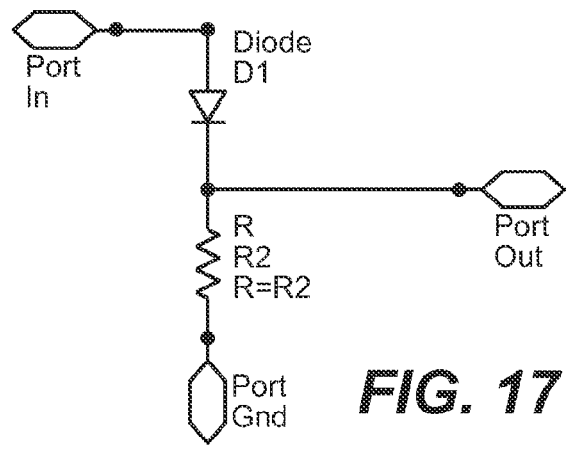
FIG. 17 is a detailed circuit diagram of an alternate simple embodiment of level shifter block X2 shown in FIG. 15.

Several embodiments of the level shifter are convenient, depending on the application. FIG. 16 shows a very basic level shifter realization. Where a small amount of drop from Vin1 is desired, FIG. 17 shows a simple approach. Where a specific output voltage is desired, i.e. a regulating function is desired in addition to noise reduction, FIG. 18 shows a simple way to achieve this.

Figure 18:
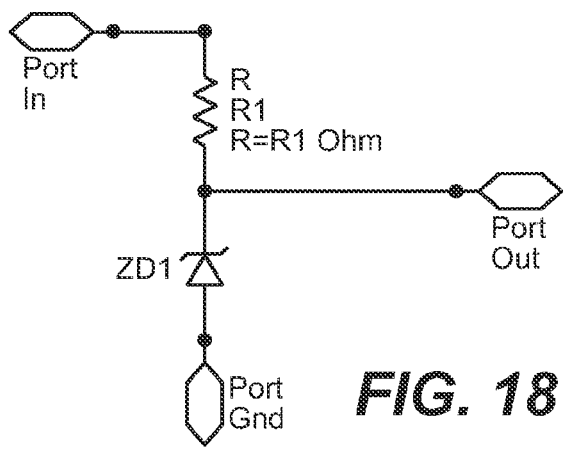
FIG. 18 is a detailed circuit diagram of an alternate simple embodiment of the level shifter block X2 shown in FIG. 15, wherein some voltage regulation is incorporated into level shifter block X2.
Figure 19:
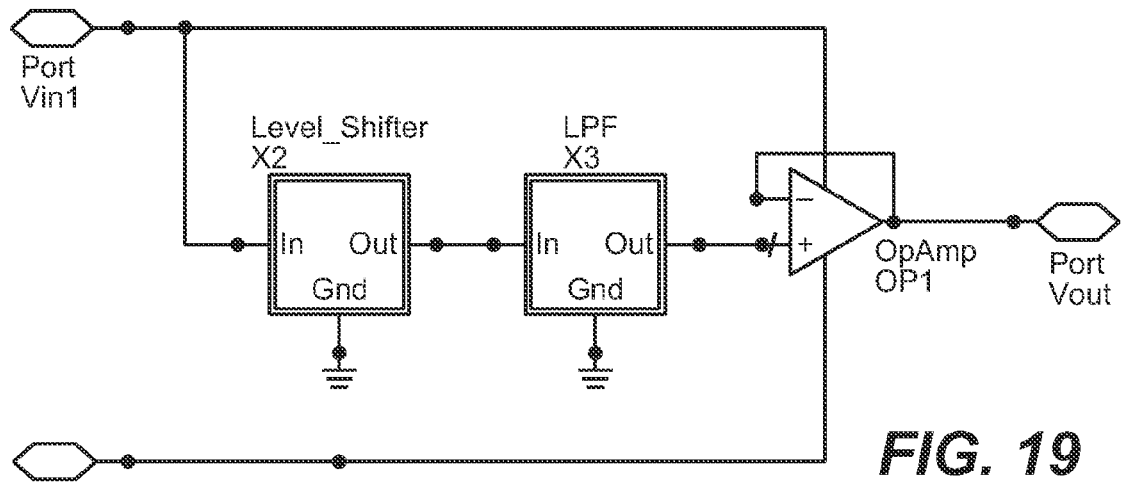
FIG. 19 is a simplified block circuit diagram of the embodiment of the invention shown in FIG. 15, wherein the level shifter circuit of FIG. 18 is used as level shifter block X2, and the ground port of level shifter block X2 is connected to system ground.

The level shifter of FIG. 18 requires that the ground port of the level shifter be connected to the system ground, as shown in FIG. 19.

It is not always convenient to generate the voltage Vin3, particularly when it cannot simply be set to ground because the value of Vin1 is too large for the operational amplifier. In this case the circuit of FIG. 20 can be used. This circuit utilizes a voltage clamp X1 to setup the operating voltage for amplifier OP1.

Figure 21:
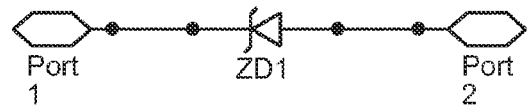
FIG. 21 is a circuit diagram of a preferred embodiment of voltage clamp block X1, wherein a zener diode functions voltage clamp block X1.

The difference between this voltage and the input voltage Vin is dropped across a current regulator circuit X5. The preferred embodiment of X1 is simply a zener diode, as shown in FIG. 21.

A very simple realization of the current regulator is simply a resistor. The value of the resistor is set to provide the desired operating current in the opamp and the voltage clamp, depending on the value of the input voltage Vin.

Figure 22:
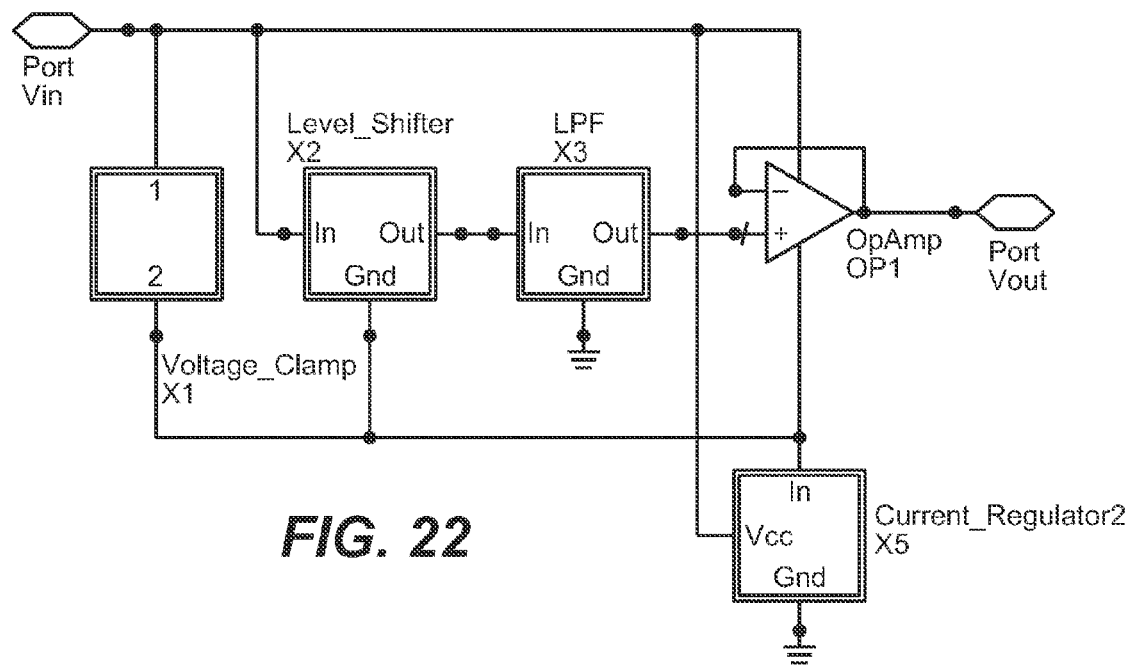
FIG. 22 is a simplified block circuit diagram of the embodiment of the invention shown in FIG. 19, wherein a current regulator block X5 consists of an active current regulator.
Figure 23:
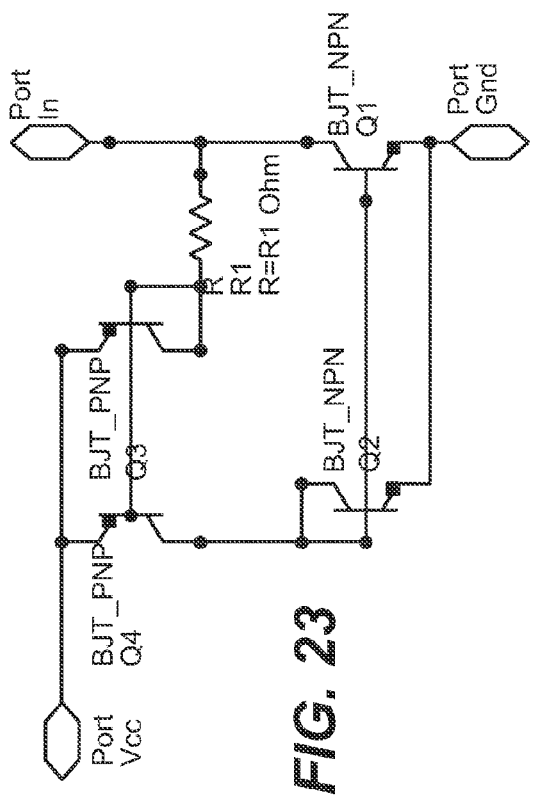
FIG. 23 is a circuit diagram of a preferred embodiment of current regulator block X5 shown in FIG. 22.

A more universal circuit can be made by replacing the simple resistor with an active current regulator that sets current to a desired value that does not depend on input supply voltage. This is shown in FIG. 22. The preferred embodiment of the current regulator of FIG. 22 is shown in FIG. 23. The circuit in FIG. 23 uses a pair of current mirrors to setup the "tail current" of the invention without regard to input voltage. This is particularly useful in applications intended as universal upgrades to existing power supply circuits.

Figure 24:
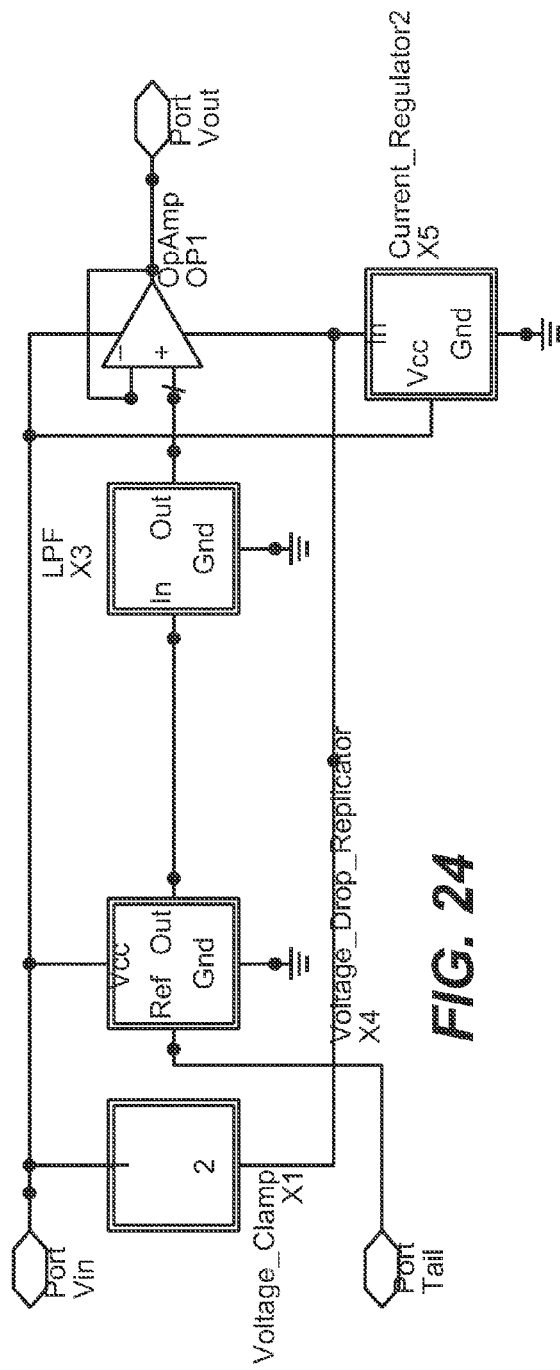
FIG. 24 is a simplified block circuit diagram of the embodiment of the invention shown in FIG. 22, wherein a voltage drop replicator block X4 replaces level shifter X2.

A great many existing power supplies are built around the ubiquitous three-terminal voltage regulator. In order to use the invention in conjunction with such regulators it is necessary to allow the output voltage of the regulator to rise exactly as much as the dropout voltage of the invention. In this way the low noise output voltage will match the intended output voltage of the regulator. This can be accomplished by providing a regulator "tail" port, as shown in FIG. 24.

The tail of the voltage regulator is connected to the tail port of a voltage drop replicator X4. The voltage drop replicator allows the tail voltage of the regulator to rise by an amount which is sufficient to support the dropout voltage of the opamp. This causes the output voltage of the regulator to rise by the same amount. A further purpose of the voltage drop replicator is to replicate the aforementioned drop between Vcc and the output port of the replicator. In this way the output voltage from the invention is substantially identical to the rated output voltage of the regulator.

Figure 25:
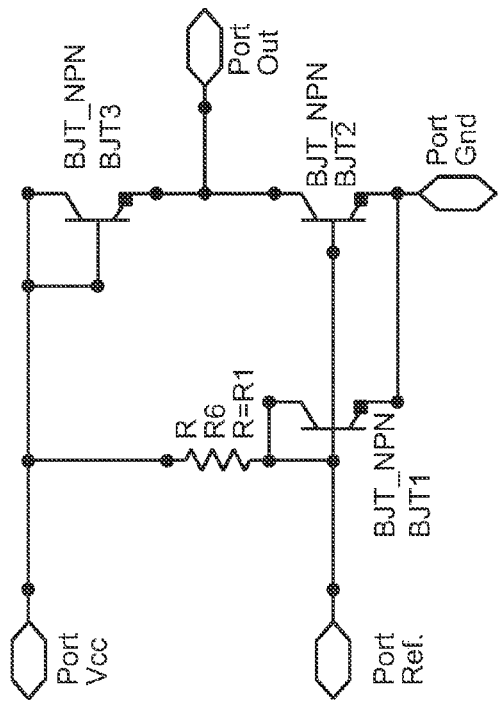
FIG. 25 is a circuit diagram of a preferred embodiment of voltage drop replicator block X4 shown in FIG. 24.
Figure 26:
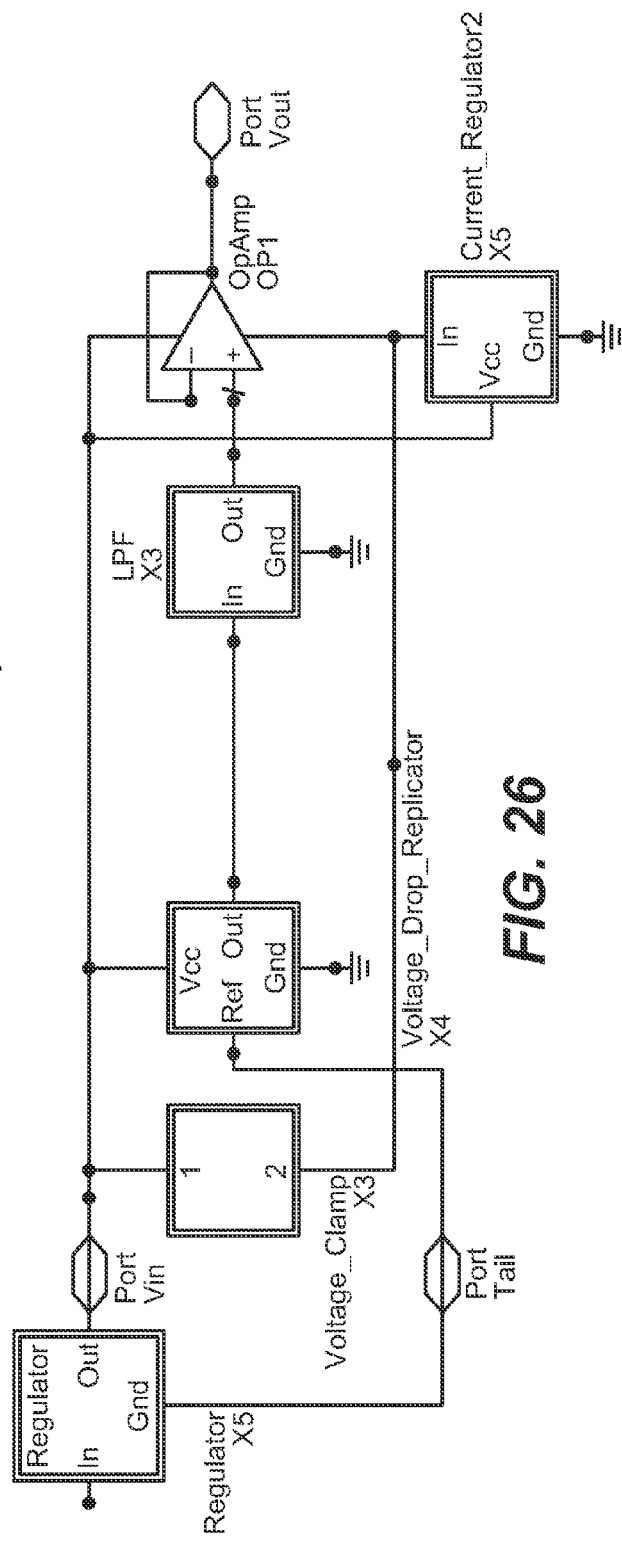
FIG. 26 is a simplified block circuit diagram of the embodiment of the invention shown in FIG. 25, wherein port Ref of voltage drop replicator block X4 provides a ground reference to external voltage regulator X6.

A preferred embodiment of the voltage drop replicator is shown in FIG. 25. The replicator allows the regulator tail current to bias the base of BJT1. The current in BJT1 is then mirrored into BJT3, so that the drop across BJT3 will be substantially the same as that across BJT1. An implementation of this concept with an existing voltage regulator is shown in FIG. 26.

It should be appreciated that all of the foregoing can be implemented for negative power supply voltages with equal ease, simply by reversing the polarity of diodes and opamp supply rails of the previous schematics. It should also be understood that all of the same results can be achieved by using FET devices instead of bipolar transistors.

Now taking the last set of drawings in order, and referring initially to FIG. 10, there is shown a simplified block circuit diagram of an embodiment of the invention, wherein filtering of direct current (DC) power is accomplished through a power correcting arrangement.

In FIG. 10, a DC voltage is applied to port Vin1, and a less positive DC voltage is applied to port Vin3. These input voltages provide the rail supply voltages for operational amplifier OP1. Port Vin1 is connected directly to the positive power input pin of operational amplifier OP1. Port Vin3 is connected directly to the negative power input pin of operational amplifier OP1. Port Vin2 is connected directly to port In of filter block X3. The DC voltage received via port Vin2 is the voltage from which noise will be filtered. Filter block X3 filters the noise from the DC voltage applied to port In of filter block X3. The voltage at port Out of filter block X3 is applied to the non-inverting input of operational amplifier OP1.

Operational amplifier OP1 is configured as a non-inverting unity gain buffer amplifier (note that the output of operational amplifier OP1 is connected directly to the inverting input of operational amplifier OP1). Operational amplifier OP1 amplifies the filtered output of filter block X3, applying the filtered and amplified signal to port V_out. In this manner, the input DC power voltage is filtered, and the filtered version of the signal is passed via port V_out to the load circuits.

Referring next to FIG. 11, there is shown a detailed circuit diagram of a preferred embodiment of the filter block X3 shown in FIG. 10. In this embodiment, a circuit comprised of series resistor R1 (connected directly between port In and port Out of filter block X3) and parallel capacitor C1 (connected directly between port Gnd and port Out of filter block X3) provides a low pass filter arrangement.

Figure 12:
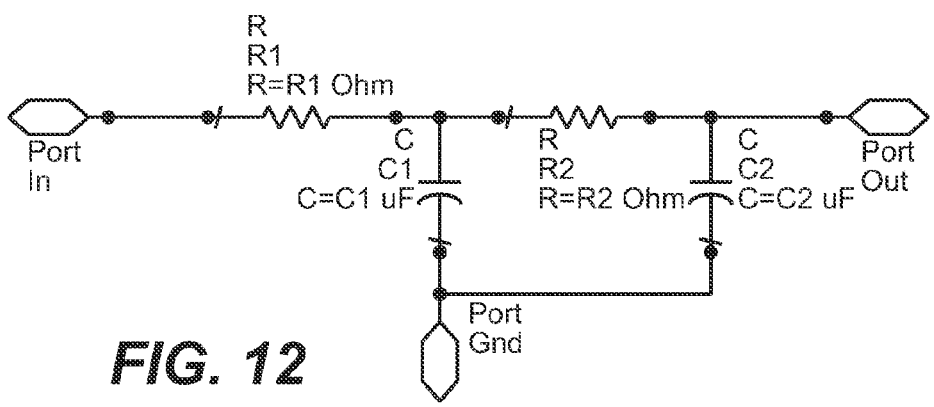
FIG. 12 is a detailed circuit diagram of an embodiment of the filter block X3 shown in FIG. 10, wherein an even more dramatic noise reduction profile is provided.

Referring now to FIG. 12, there is shown a detailed circuit diagram of an embodiment of the filter block X3 shown in FIG. 10, wherein an even more dramatic noise reduction profile is provided. In this embodiment, filter block X3 is comprised of series resistor R1 (connected directly between port In and the signal input of series resistor R2). The signal output of series resistor R2 is connected directly to port Out of filter block X3. Parallel capacitor C1 (connected directly between port Gnd and the junction of series resistor R1 and series resistor R2). Parallel capacitor C2 (connected directly between port Gnd and the junction of series resistor R2 and port Out of filter block X3). This arrangement provides a low pass filter arrangement that provides more robust filtering of the input voltage.

Referring now to FIG. 13, there is shown a circuit diagram of a preferred embodiment of operational amplifier OP1 shown in FIG. 10. In this embodiment, a zener diode ZD1 is connected directly between the output pin of operational amplifier OP1 and the positive power input pin of operational amplifier OP1. This arrangement is used to prevent the output pin voltage of operational amplifier OP1 from falling below the lower power supply rail during circuit power-up conditions (thus preventing operational amplifier OP1 from latching up).

Referring now to FIG. 14, there is shown a simplified block circuit diagram of an embodiment of the invention, wherein filtering of direct current (DC) power is accomplished through a power correcting arrangement, and wherein the lower rail voltage of operational amplifier OP1 is identical to the system ground.

In FIG. 14, a DC voltage that is positive with respect to circuit ground is applied to port Vin1. This input voltage and circuit ground provide the rail supply voltages for operational amplifier OP1. Port Vin1 is connected directly to the positive power input pin of operational amplifier OP1. The negative power input pin of operational amplifier OP1 is connected directly to circuit ground. Port Vin2 is connected directly to port In of filter block X3. The DC voltage received via port Vin2 is the voltage from which noise will be filtered. Filter block X3 filters the noise from the DC voltage applied to port In of filter block X3. The voltage at port Out of filter block X3 is applied to the non-inverting input of operational amplifier OP1.

Operational amplifier OP1 is configured as a non-inverting unity gain buffer amplifier (note that the output of operational amplifier OP1 is connected directly to the inverting input of operational amplifier OP1). Operational amplifier OP1 amplifies the filtered output of filter block X3, applying the filtered and amplified signal to port V_out. In this manner, the input DC power voltage is filtered, and the filtered version of the signal is passed via port V_out to the load circuits.

Figure 15:
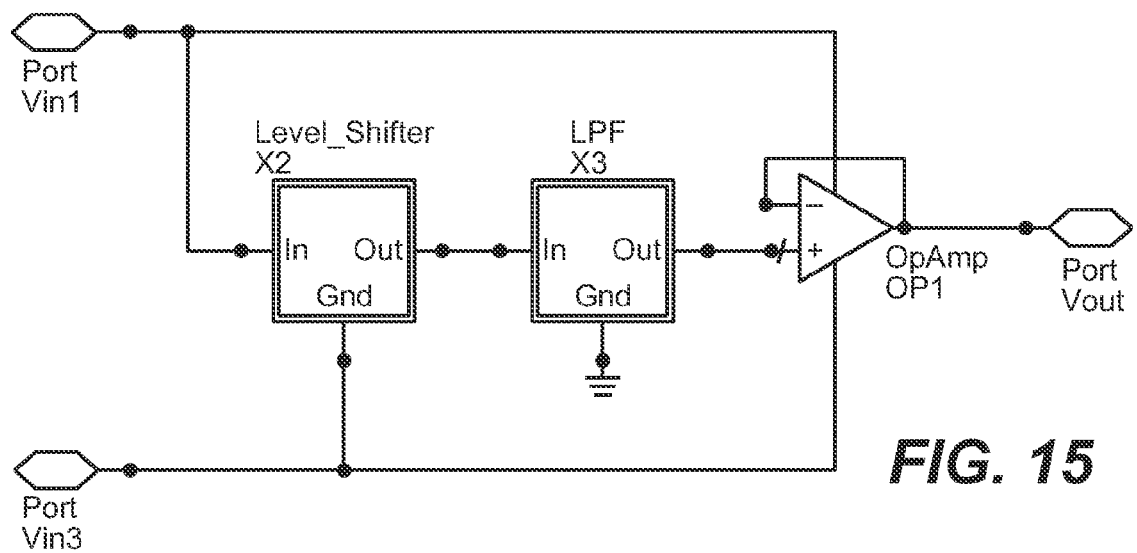
FIG. 15 is a simplified block circuit diagram of an embodiment of the invention, wherein filtering of direct current (DC) power is accomplished through a power correcting arrangement, and wherein a level shifter block is added.

Referring now to FIG. 15, there is shown a simplified block circuit diagram of an embodiment of the invention, wherein filtering of direct current (DC) power is accomplished through a power correcting arrangement, and wherein level shifter block X2 is added.

In this embodiment, a reference voltage for the non-inverting input pin of operational amplifier OP1 is derived from the voltage at port Vin1 after being level-shifted by level shifter block X2 and filtered by filter block X3. Port Gnd of level shifter block X2 is connected directly to port Vin3. Port In of level shifter block X2 is connected directly to port Vin1. Port Out of level shifter block X2 is connected directly to port In of filter block X3. Port Out of filter block X3 is connected directly to the non-inverting input pin of operational amplifier OP1. The filtered DC voltage at port Vout of this embodiment is equal to the reference voltage derived from Vin1 by level shifter block X2.

Referring now to FIG. 16, there is shown a detailed circuit diagram of a simple embodiment of level shifter block X2 shown in FIG. 6. In this embodiment, level shifter block X2 is comprised of a resistive voltage divider network. The voltage present at port In is connected to the top of resistor R1. Port Gnd is connected to the bottom of resistor R2. Resistor R1 and resistor R2 combine to form a voltage divider network, wherein port Out is connected to the junction between resistor R1 and resistor R2. In this manner, the voltage arriving at port In is stepped down (level-shifted) at port Out from its original value.

Referring now to FIG. 17, there is shown a detailed circuit diagram of an alternate simple embodiment of level shifter block X2 shown in FIG. 15. In this embodiment, level shifter block X2 is comprised of a diode/resistor voltage divider network. The voltage present at port In is connected to the top (positive node) of diode D1. Port Gnd is connected to the bottom of resistor R2. Diode D1 and resistor R2 combine to form a voltage divider network, wherein port Out is connected to the junction between diode D1 and resistor R2. In this manner, the voltage arriving at port In is stepped down (level-shifted) at port Out from its original value.

Referring now to FIG. 18, there is shown a detailed circuit diagram of an alternate simple embodiment of the level shifter block X2 shown in FIG. 15, wherein some voltage regulation is incorporated into level shifter block X2. In this embodiment, level shifter block X2 is comprised of a resistor/Zener diode voltage divider network. The voltage present at port In is connected to the top of resistor R1. Port Gnd is connected to the bottom (anode) of Zener diode ZD1. Resistor R1 and Zener diode ZD1 and combine to form a voltage divider network, wherein port Out is connected to the junction between resistor R1 and Zener diode ZD1. In this manner, the voltage arriving at port In is stepped down (level-shifted) at port Out from its original value. Additionally, the voltage present at port Out is limited by Zener diode ZD1.

Referring now to FIG. 19, there is shown a simplified block circuit diagram of the embodiment of the invention shown in FIG. 15, wherein the level shifter circuit of FIG. 19 is used as level shifter block X2. In this embodiment, port Gnd of level shifter block X2 is connected to system ground.

Figure 20:
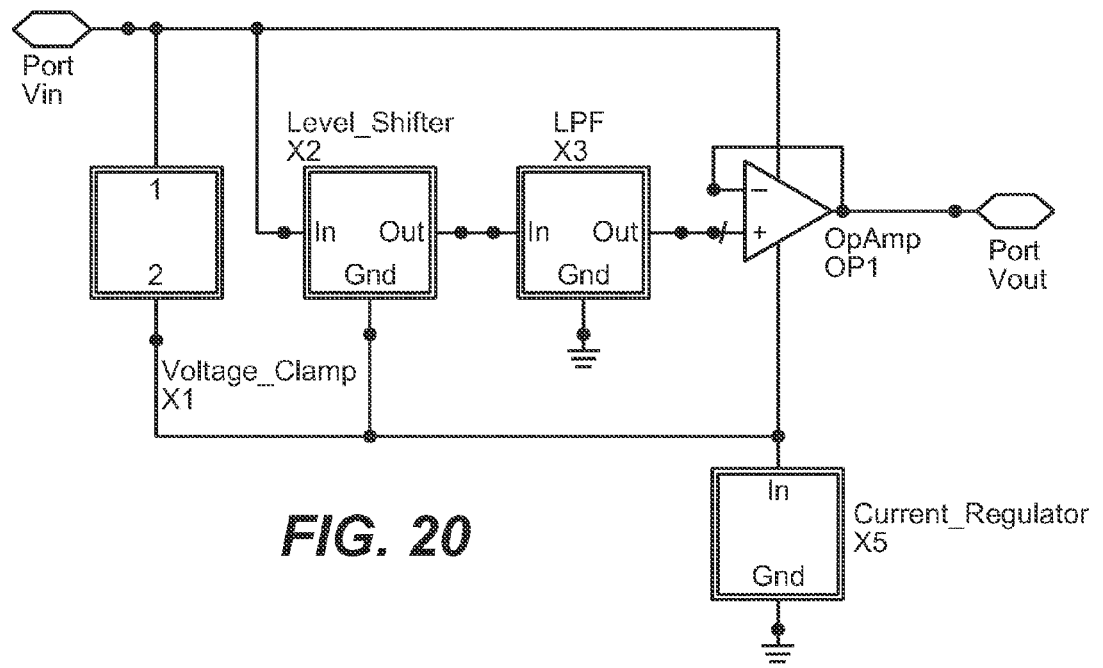
FIG. 20 is a simplified block circuit diagram of the embodiment of the invention shown in FIG. 19, wherein a voltage clamp block X1 and passive current regulator block X5 are added.

Referring now to FIG. 20, there is shown a simplified block circuit diagram of the embodiment of the invention shown in FIG. 19, wherein a voltage clamp block X1 and passive current regulator block X5 are added. In this embodiment, the negative power supply rail voltage for operational amplifier OP1 is derived from output pin 2 of voltage clamp block X1. The input pin 1 of voltage clamp block X1 is connected to Vin1. The output pin 2 of clamp block X1 is connected in parallel to the negative power input pin of operational amplifier OP1 and port In of current regulator block X5. Port Gnd of voltage clamp block X1 is connected to circuit ground. Current regulator block X5 is used to regulate the current that passes through voltage clamp block X1. In this manner, the supply voltage provided to the negative power input pin of operational amplifier OP1 can be set at a value other than circuit ground. This is useful when the voltage at the positive power input pin of operational amplifier OP1 is too high to allow using circuit ground for the negative power input to operational amplifier OP1.

Referring now to FIG. 21, there is shown a circuit diagram of a preferred embodiment of voltage clamp block X1, wherein a Zener diode functions voltage clamp block X1. In this embodiment of voltage clamp block X1, the cathode of Zener diode ZD1 is connected directly to port 1 of voltage clamp block X1, and the anode of Zener diode ZD1 is connected directly to port 2 of voltage clamp block X1.

Referring now to FIG. 22, there is shown a simplified block circuit diagram of the embodiment of the invention shown in FIG. 19, wherein a current regulator block X5 consists of an active current regulator. In this embodiment, port Gnd of current regulator block X5 is connected to circuit ground, and port In of current regulator block X5 is connected in parallel to the input power pin of operational amplifier OP1 and pin 2 of voltage clamp block X1. Port Vcc of current regulator block X5 is connected directly to port Vin.

Referring now to FIG. 23, there is shown a simplified circuit diagram of a preferred embodiment of current regulator block X5 shown in FIG. 22. In this embodiment, port Vcc of current regulator block X5 receives the voltage from the positive DC power supply rail (as seen in FIG. 22). Port Vcc is connected in parallel to the emitters of PNP transistor Q4 and PNP transistor Q3, thereby supplying a power source to the current regulator block X5. Port In of current regulator block X5 receives the voltage from the negative DC power supply rail (as seen in FIG. 22). Port In is connected in parallel to one side of resistor R1 and to the collector of NPN transistor Q1, thereby supplying a negative bias to the bases of PNP transistors Q3 and Q4. Port Gnd is connected in parallel with the emitters of NPN transistor Q2 and NPN transistor Q1, thereby supplying a circuit ground to the current regulator block X5. In this arrangement, NPN transistor Q1 is in series with, and used to regulate, the current flowing between circuit ground (port Gnd) and port In without regard to the input voltage. The value of resistor R1 is used to set the target current value.

Turning next to FIG. 24, there is shown a simplified block circuit diagram of the embodiment of the invention shown in FIG. 22, wherein a voltage drop replicator block X4 replaces level shifter X2. Voltage drop replicator block X4 is used to raise the voltage at Port Tail, in order to generate a more positive ground reference to a well known 3-terminal voltage regulator when used in conjunction with such a device (See regulator X5 in FIG. 26). When the ground reference of a 3-terminal voltage regulator is made more positive, the final output voltage of that regulator also rises, thereby providing the extra voltage to accommodate the dropout voltage of operational amplifier OP1. This effectively keeps the voltage at Port Vout of the invention set to the rated output of the 3-terminal voltage regulator. Port Vcc of voltage drop replicator block X4 is connected directly to port Vin, thereby providing the positive DC power to the internal components of voltage drop replicator block X4. Circuit ground is provided to voltage drop replicator block X4 via port Gnd of voltage drop replicator block X4. Port Ref of voltage drop replicator block X4 is connected directly to port Tail. Port Tail is used to provide a reference DC voltage to the ground terminal of an external 3-terminal voltage regulator. The output voltage of voltage drop replicator block X4 is connected directly to port In of low pass filter block X3, thereby providing an reference voltage to the system adjusted to compensate for the dropout voltage of operational amplifier OP1.

Referring now to FIG. 25, there is shown a circuit diagram of a preferred embodiment of voltage drop replicator block X4 shown in FIG. 24 and FIG. 26. In this embodiment, the voltage present at port Vcc is used to bias the base of NPN transistor BJT1 via resistor R1. NPN transistor BJT2 has its base connected in parallel with the base of NPN transistor BJT1. In this configuration, the current flowing through NPN transistor BJT1 is mirrored in NPN transistor BJT3. The effect is that the voltage drop across NPN transistor BJT3 will be substantially the same as the voltage dropped across NPN transistor BJT1.

Referring now to FIG. 26, there is shown a simplified block circuit diagram of the embodiment of the invention shown in FIG. 25, wherein port Ref of voltage drop replicator block X4 provides a ground reference to external voltage regulator X6. In this application of the invention, port Gnd of external 3-terminal regulator X5 has its ground reference set by the voltage at port Tail through the direct connection between port Tail and port Gnd of external voltage regulator X6. Port In of external 3-terminal regulator X5 is connected to an external DC current source. Port Out of external 3-terminal regulator X5 is connected to port Vin of the invention, thereby providing a positive DC voltage rail source to the invention. In this application, the filtered output DC voltage present at port Vout is substantially equivalent to the rated output of external 3-terminal regulator X5.

The foregoing disclosure is sufficient to enable those with skill in the relevant art to practice the invention without undue experimentation. The disclosure further provides the best mode of practicing the invention now contemplated by the inventor.

While the particular noise reduction circuit and method herein shown and disclosed in detail is fully capable of attaining the objects and providing the advantages stated herein, it is to be understood that it is merely illustrative of the presently preferred embodiment of the invention and that no limitations are intended concerning the detail of construction or design shown other than as defined in the appended claims. Accordingly, the proper scope of the present invention should be determined only by the broadest interpretation of the appended claims so as to encompass obvious modifications as well as all relationships equivalent to those illustrated in the drawings and described in the specification.

What is claimed as invention is:

1. An electronic noise-filtering circuit for removing noise from the neural leg of an alternating current power source, wherein the alternating current has a substantially fixed frequency and is delivered to a load circuit by way of three electrical conductors, with said system including generator for generating the alternating current and receiving returned alternating current, The generator being electrically connected to a hot first conductor for carrying the alternating current to the load circuit and a neutral second conductor for returning the alternating current from the load circuit to the generator, and a ground third conductor for providing a current oath to Earth ground, and wherein the load circuit receives the alternating current via the hot first conductor and returns the alternating electrical current via the neutral second conductor and has a local Earth around connection electrically connected to the ground third conductor, said noise-filtering circuit comprising:

a first input terminal for connecting to said hot first conductor;

a second input terminal for connecting to said neutral second conductor;

a third input terminal for connecting to said ground third conductor;

an output terminal for connecting to said neutral second conductor;

first and second rectifying diodes;

an operational amplifier; and a transformer;

wherein said first input terminal and said second input terminal are connected across the primary windings of said transformer; one side of the secondary winding of said transformer being connected to said second input terminal, and the other side of said secondary winding of said transformer being connected to the anode of said first rectifying diode and the cathode of said second rectifying diode; said transformer sending to said anode of said first rectifying diode and said cathode of said second rectifying diode either a stepped-down or boosted version of the alternating current signal received across said hot first conductor; said first rectifying diode passing only the positive half of the alternating current signal to a positive power source input of said operational amplifier, and said second rectifying diode passing only the negative half of the alternating current signal to a negative power source input of said operational amplifier; said third input terminal being directly in communication with a non-inverting input of said operational amplifier; said operational amplifier being arranged for unity gain throughput; said operational amplifier receives and amplifies the voltage on said ground third conductor; the output of said operational amplifier being in communication with said output terminal through which the amplified version of said voltage on said ground third conductor is delivered to said neutral second conductor, thereby eliminating, on the load circuit side of said noise-filtering circuit the noise-generated instantaneous differences in voltage between said ground third conductor and said second neutral conductor.

2. The electronic noise-filtering circuit of claim 1, wherein said transformer is a step-down transformer.

3. The electronic noise-filtering circuit of claim 1, wherein said transformer is a boost transformer.

4. The electronic noise-filtering circuit of claim 1, further including a first filter capacitor disposed on said positive power source input of said operational amplifier, and a second filter capacitor disposed on said negative power source input of said operational amplifier.

5. The electronic noise-filtering circuit of claim 1, wherein said operational amplifier further includes an output stage.

6. The electronic noise-filtering circuit of claim 5, wherein said output stage is bipolar.

7. The electronic noise-filtering circuit of claim 5, wherein said output stage includes Zobel networks for stabilizing said operational amplifier under varying load conditions.

8. An electronic noise-filtering circuit for removing noise from an alternating electric current source that has a substantially fixed frequency, comprising:

an input terminal;
an output terminal;
a circuit ground reference;
first and second rectifying diodes;
an electronic filter element including an unfiltered signal input node, a filtered signal output node, and a filter ground node for passing filtered energy to said circuit ground reference, wherein said electronic filter element provides a first impedance at the substantially fixed frequency and an impedance greater than said first impedance at frequencies other than said fixed frequency;
an operational amplifier arranged for substantial unity gain throughput, said operational amplifier including a first power terminal for receiving direct current, a second power terminal for returning said direct current to its source, a non-inverting input for receiving a signal to be amplified, and an amplified signal output;
wherein the anode of said first rectifying diode is electrically connected to said input terminal and receiving said alternating electric current, and the cathode of said first rectifying diode is electrically connected to said first power terminal of said operational amplifier; and
wherein the cathode of said second rectifying diode is electrically connected to said input terminal and receiving said alternating electric current, and the anode of said second rectifying diode is electrically connected to said second power terminal of said operational amplifier; and
wherein said unfiltered signal input node of said electronic filter element is electrically connected to said input terminal and receives the alternating electric current, and said filter ground node of said electronic filter element is electrically connected to said circuit ground reference, and said filtered signal output node of said electronic filter element is electrically connected to said non-inverting input of said operational amplifier;

wherein said electronic filter element acts in a band-pass configuration, substantially transferring the energy of frequencies other than the fixed frequency to said ground reference while passing the energy of the fixed frequency as a filtered output signal to said non-inverting input of said operational amplifier; and wherein said operational amplifier receives the filtered output signal from said electronic filter element and generates, at said amplified signal output, an amplified version of said filtered output signal, said amplified signal output being electrically connected to said output terminal through which the amplified version of the filtered signal is delivered as an alternating current power source to a first alternating current power input of an external load circuit that has as a second alternating current power input electrically connected to said circuit ground reference.

9. In a system where alternating electric current that has a substantially fixed frequency is delivered to a load circuit by way of three electrical conductors, with said system including a generator for generating said alternating electric current and receiving returned alternating electric current, with said generator being electrically connected to a first electrical conductor for carrying said alternating electric current to said load circuit and a second electrical conductor for returning said alternating electric current from said load circuit to said generator and a third electrical conductor for providing a current path to Earth ground, and wherein said load circuit receives said alternating electric current via said first conductor and returns said alternating electrical current via said second conductor and has a local Earth ground connection electrically connected to said third conductor, an electronic noise-filtering circuit for removing noise from said second conductor, said noise-filtering circuit electrically connected to said second conductor, and in series between said generator and said load circuit, comprising:

a circuit ground reference;
an input terminal electrically connected to said second conductor;
an output terminal electrically connected in the place of the second conductor connection of said load circuit;
first and second rectifying diodes;
an electronic filter element providing at least some impedance at said fixed frequency and significant impedance at other frequencies, including an unfiltered signal input node, a filtered signal output node; and a filter ground node for passing filtered energy to said circuit ground reference;
an operational amplifier arranged for substantial unity gain throughput, said operational amplifier including a first power terminal for receiving direct current a second power terminal for returning said direct current to its source, a non-inverting input for receiving a signal to be amplified, and an amplified signal output;
a boost transformer having a primary winding and a secondary winding, first and second primary winding terminals, and first and second secondary winding terminals, wherein said primary winding is configured to induce a current onto said secondary winding that is greater than the current passed through said primary winding;

wherein said first primary winding terminal of said boost transformer is electrically connected to said input terminal and receiving said alternating electric current, and said second primary winding terminal of said boost transformer is electrically connected to said circuit ground reference; and wherein said second secondary winding terminal of said boost transformer is electrically connected to said first input terminal; and wherein the anode of said first rectifying diode is electrically connected to said first secondary winding terminal of said boost transformer and receives an increased alternating electric current from said secondary winding of said boost transformer, and the cathode of said first rectifying diode is electrically connected to said first power terminal of said operational amplifier; and wherein the cathode of said second rectifying diode is electrically connected to said first secondary winding terminal of said boost transformer and receives in increased alternating electric current, and the anode of said second rectifying diode is electrically connected to said second power terminal of said operational amplifier; and wherein said unfiltered signal input node of said electronic filter element electrically connected to said input terminal and receiving said alternating electric current, and said filter ground node of said electronic filter element is electrically connected to said circuit ground reference, and said filtered signal output node of said electronic filter element is electrically connected to said non-inverting input of said operational amplifier; and wherein said electronic filter element acts in a band-pass configuration, substantially transferring die energy of frequencies other than the fixed frequency to said ground reference while passing the energy of the fixed frequency as a filtered output signal to said non-inverting input of said operational amplifier; and wherein said operational amplifier receives said filtered output signal from said electronic filter element and generates, at said amplified signal output, an amplified version of said filtered output signal, said amplified signal output being electrically connected to said output terminal through which said amplified version of said filtered signal is sent to said load circuit.

10. The electronic noise-filtering circuit of claim 9, further including a first filter capacitor disposed on said positive power source input of said operational amplifier, and a second filter capacitor disposed on said negative power source input of said operational amplifier.

11. The electronic noise-filtering circuit of claim 9, wherein said operational amplifier further includes an output stage.

12. The electronic noise-filtering circuit of claim 11, wherein said output stage is bipolar.

13. The electronic noise-filtering circuit of claim 11, wherein said output stage includes Zobel networks for stabilizing said operational amplifier under varying load conditions.

14. An electronic noise-filter circuit for use in a system where an electric current is delivered to a load circuit by way of a first electrical conductor and a common circuit ground, wherein the system includes a direct current power supply for generating direct electric current at a substantially fixed voltage, and receiving returned direct electric current, with the output of the power supply being electrically connected to a first electrical conductor for carrying the direct electric current to the load circuit and a current path to the common circuit ground, through which the direct electrical current is returned from the load circuit to the power supply, and wherein the load circuit receives the direct electric current via the first electrical conductor and returns the direct electrical current via the common circuit ground, and further including a first direct current voltage source, wherein the first direct current voltage source generates a first reference direct current voltage that is more positive than the substantially fixed voltage, and a second direct current voltage source, wherein the second direct current voltage source generates a second reference direct current voltage that is more negative than the substantially fixed voltage, said electronic noise-filtering circuit electrically connected to the first conductor, and in series between the power supply and the load circuit, said noise-filtering circuit comprising:

a circuit ground reference;

a first input terminal electrically connected to said first direct current voltage source;

a second input terminal electrically connected to said second direct current voltage source;

a third input terminal electrically connected to said first electrical conductor;

an output terminal electrically connected in the place of the first conductor connection of said load circuit;

an electronic filter element providing at least some impedance at all frequencies, including an unfiltered signal input node, a filtered signal output node, and a filter ground node for passing filtered energy to said circuit ground reference;

an operational amplifier arranged for substantial unity gain throughput, having a first power terminal for receiving direct current, a second power terminal for returning the direct current to its source, a non-inverting input for receiving a signal to be amplified; and an amplified signal output;

wherein said first power terminal of said operational amplifier is electrically connected to said first input terminal and receiving said first reference direct current voltage from said first direct current voltage source; and said second power terminal of said operational amplifier is electrically connected to said second input terminal and receiving said second reference direct current voltage from said second direct current voltage source; and said unfiltered signal input node of said electronic filter element is electrically connected to said third input terminal and receiving said direct electrical current voltage of said direct current power supply;

said filtered signal output node of said electronic filter clement being electrically connected to said non-inverting input of said operational amplifier;

said unfiltered signal input node of said electronic filter element electrically connected to said third input terminal and receiving said direct electrical current voltage of said direct current power supply, and said filter ground node of said electronic filter element is electrically connected to said circuit ground reference, and said filtered signal output node of said electronic filter clement is electrically connected to said non-inverting input of said operational amplifier; and said electronic filter element acting in a band-pass configuration, substantially transferring the energy of all frequencies to said ground reference while passing a filtered direct current output to said non-inverting input of said operational amplifier;

said operational amplifier receives said filtered direct current output from said electronic filter element and generates, at said amplified signal output, an amplified version of said filtered direct current;

the output of said operational amplifier being electrically connected to said output terminal through which the amplified version of said filtered output of said filter element is sent to the load circuit.

15. The circuit of claim 14, further including a level shifter disposed on said first power terminal of said operational amplifier.

* * * * *